(12) United States Patent
Guo et al.

(10) Patent No.: US 12,354,563 B2
(45) Date of Patent: Jul. 8, 2025

(54) ORGANIC LIGHT EMITTING DISPLAY ALLEVIATING COLOR DISTORTION OF INTEGRATED CAMERA MODULE

(71) Applicant: Hubei Yangtze Industrial Innovation Center of Advanced Display Co., LTD., Wuhan (CN)

(72) Inventors: Wanlong Guo, Wuhan (CN); Qijun Yao, Wuhan (CN); Feng Lu, Wuhan (CN)

(73) Assignee: Hubei Yangtze Industrial Innovation Center of Advanced Display Co., LTD., Wuhan (CN)

( * ) Notice: Subject to any disclaimer, the term of this patent is extended or adjusted under 35 U.S.C. 154(b) by 0 days.

(21) Appl. No.: 18/122,283

(22) Filed: Mar. 16, 2023

(65) Prior Publication Data
US 2024/0221690 A1    Jul. 4, 2024

(30) Foreign Application Priority Data
Dec. 28, 2022  (CN) .......................... 202211699868.6

(51) Int. Cl.
| | | |
|---|---|---|
| G09G 3/34 | (2006.01) | |
| G02F 1/1335 | (2006.01) | |
| G09G 5/02 | (2006.01) | |

(52) U.S. Cl.
CPC ..... *G09G 3/3413* (2013.01); *G02F 1/133514* (2013.01); *G09G 5/028* (2013.01)

(58) Field of Classification Search
CPC .......... G09G 3/30; G09G 3/32; G09G 3/3208; G09G 3/3216; G09G 3/3225;
(Continued)

(56) References Cited

U.S. PATENT DOCUMENTS

| | | | | |
|---|---|---|---|---|
| 2010/0110690 A1* | 5/2010 | Hsu | .................. | G02F 1/133516 252/582 |
| 2013/0119239 A1* | 5/2013 | Lee | .................. | H01L 27/14621 250/208.1 |

(Continued)

FOREIGN PATENT DOCUMENTS

| | | |
|---|---|---|
| CN | 111554829 A | 8/2020 |
| CN | 111882995 A | 11/2020 |
| CN | 113287291 A | 8/2021 |

*Primary Examiner* — Ke Xiao
*Assistant Examiner* — Nelson Lam
(74) *Attorney, Agent, or Firm* — Anova Law Group, PLLC

(57) ABSTRACT

Display module includes a display panel, the display panel including at least one light-transmitting display area; at least one camera module, the at least one camera module being located on a side away from a light-emitting surface of the display panel, the camera module being arranged to correspond to the at least one light-transmitting display area; at least one of the at least one camera module including a photosensitive element and a light filtering structure, the light filtering structure being located on a side of the photosensitive element facing the display panel, the light filtering structure including at least one color resist, along a direction perpendicular to a plane where the camera module is located, the color resist at least partially overlapping with the photosensitive element, the light filtering structure including a monochrome filter structure, the at least one camera module including the monochrome filter structure.

21 Claims, 20 Drawing Sheets

(58) Field of Classification Search
CPC .... G09G 3/3233; G09G 3/3241; G09G 3/325; G09G 3/3258; G09G 3/3266; G09G 3/3274; G09G 3/3277; G09G 3/3281; G09G 3/3285; G09G 3/3292; G09G 3/3296
USPC .................................................. 345/76–83
See application file for complete search history.

(56) References Cited

U.S. PATENT DOCUMENTS

| | | | |
|---|---|---|---|
| 2015/0163478 A1* | 6/2015 | Geiss | H04N 13/243 348/47 |
| 2015/0334309 A1* | 11/2015 | Peng | H04N 23/69 348/47 |
| 2016/0379557 A1* | 12/2016 | de Jong | G02B 5/3025 345/697 |
| 2017/0064172 A1* | 3/2017 | Vittu | H04N 23/54 |
| 2018/0234529 A1* | 8/2018 | Yu | G02B 27/646 |
| 2019/0281232 A1* | 9/2019 | Lee | H04N 23/951 |
| 2021/0075896 A1* | 3/2021 | Mao | H04M 1/18 |
| 2021/0360152 A1* | 11/2021 | Yuan | H04N 23/81 |
| 2022/0069261 A1* | 3/2022 | Tang | H10K 59/8792 |

\* cited by examiner

ORGANIC LIGHT EMITTING DISPLAY ALLEVIATING COLOR DISTORTION OF INTEGRATED CAMERA MODULE

CROSS-REFERENCE TO RELATED APPLICATIONS

This application claims priority of Chinese Patent Application No. 202211699868.6, filed on Dec. 28, 2022, the entire content of which is hereby incorporated by reference.

TECHNICAL FIELD

The present disclosure relates to the field of display technology and, more specifically, to a display module and a display device.

BACKGROUND

With the advancement of technology and people's increasing demand for better products, the full screen with a screen ratio close to 100% has become a highly anticipated technology for smartphones. In order to achieve an ultra-high screen-to-body ratio, the front camera needs to be placed under the display. That is, a display light-transmitting area is arranged in the display screen, and the camera is placed in the area corresponding to the display light-transmitting area. In addition to the normal display function, the display light-transmitting area also has relatively high light transmission to meet the imaging requirements of the camera.

However, the transmittance of the film layer of the display panel is different for different wavelengths of light, especially the low transmittance for short-wavelength blue light, which may cause color distortion when the camera takes pictures, and affect user experience.

SUMMARY

One aspect of the present disclosure provides a display module. The display module includes a display panel. The display panel includes at least one light-transmitting display area and at least one camera module. The at least one camera module is located on a side away from a light-emitting surface of the display panel, and the at least one camera module is arranged to correspond to the at least one light-transmitting display area. The camera module includes a photosensitive element, and a light filtering structure. The light filtering structure is located on a side of the photosensitive element facing the display panel. The light filtering structure includes at least one color resist. Along a direction perpendicular to a plane where the camera module is located, the color resist at least partially overlaps with the photosensitive element. The light filtering structure includes a monochrome filter structure. The color resists in the monochrome filter structure have the same color, and the at least one camera module includes the monochrome filter structure.

Another aspect of the present disclosure provides a display device. The display device includes a display module. The display module includes a display panel. The display panel includes at least one light-transmitting display area and at least one camera module. The at least one camera module is located on a side away from a light-emitting surface of the display panel, and the at least one camera module is arranged to correspond to the at least one light-transmitting display area. The camera module includes a photosensitive element and a light filtering structure. The light filtering structure is located on a side of the photosensitive element facing the display panel. The light filtering structure includes at least one color resist. Along a direction perpendicular to a plane where the camera module is located, the color resist at least partially overlaps with the photosensitive element. The light filtering structure includes a monochrome filter structure. The color resists in the monochrome filter structure have the same color, and the at least one camera module includes the monochrome filter structure.

Consistent with the present disclosure, the display module and the display device provided by the embodiments of the present disclosure at least achieve the following beneficial effects. In the display module provided by the embodiments of the present disclosure, at least one camera module may be arranged with a monochrome filter structure, and the color of the color resists in the monochrome filter structure may be of the same color, which is beneficial to increasing the amount of light that is the same color as the color of the color resists to the photosensitive element. Further, by adding a camera module 20 including a monochrome filter structure, more signals of monochromatic light with the same color as the color resists may be collected. The camera module may be integrated with the signals collected by other camera modules. The signals collected by the camera module may compensate the light signals of some wavelengths in the signals collected by other camera modules. In this way, the color distortion of the camera module affecting the imaging effect caused by the lack of light signals of some wavelengths can be effectively alleviated, which is beneficial to improving the imaging effect when taking pictures and improving user experience.

Of course, any product implementing the technical solutions of the present disclosure does not need to achieve all of the technical effects described above at the same time.

Other features of the present disclosure and advantages thereof will become apparent from the following detailed description of exemplary embodiments of the present disclosure with reference to the accompanying drawings.

BRIEF DESCRIPTION OF THE DRAWINGS

In order to illustrate the technical solutions in accordance with the embodiments of the present disclosure more clearly, the accompanying drawings to be used for describing the embodiments are introduced briefly in the following. It is apparent that the accompanying drawings in the following description are only some embodiments of the present disclosure. Persons of ordinary skill in the art can obtain other accompanying drawings in accordance with the accompanying drawings without any creative efforts.

DETAILED DESCRIPTION OF THE EMBODIMENTS

Figure 1:
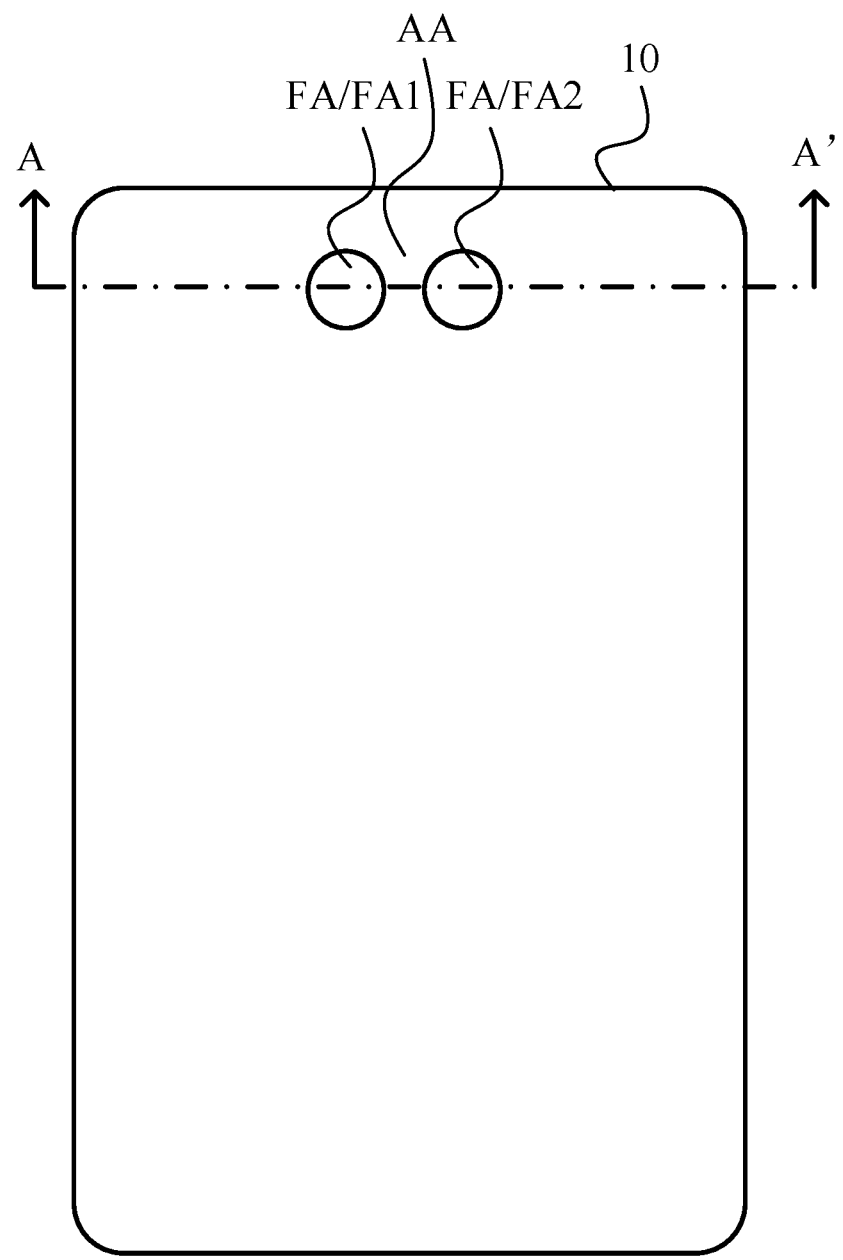
FIG. 1 is a schematic plan view of a display module according to an embodiment of the present disclosure.

Various exemplary embodiments of the present disclosure are described in detail with reference to the drawings. It should be noted that relative arrangement of components and steps, numerical expressions and values clarified in the embodiments are not intended to limit the scope of the present disclosure, unless otherwise specified.

The following description of the at least one exemplary embodiment is merely illustrative and shall not be construed as any limitation on the present disclosure and its application or use.

Techniques, methods and apparatus known to those skilled in the art may not be discussed in detail, but the techniques, methods and apparatus should be considered as a part of the specification where appropriate.

In all of the examples shown and discussed herein, any specific values are to be construed as illustrative only rather than limitation. Thus, different values may be used in other examples of the exemplary embodiments.

It should be noted that similar reference numerals and letters indicate similar items in the following drawings. Therefore, once an item is defined in one drawing, the item is unnecessary to be further discussed in subsequent drawings.

Figure 2:
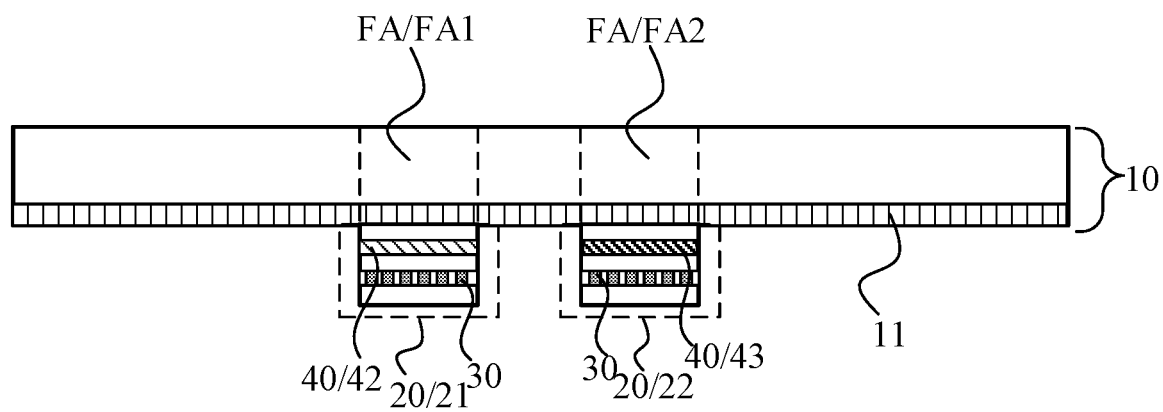
FIG. 2 is a cross-sectional view of the display module shown in FIG. 1 along line A-A'.
Figure 3:
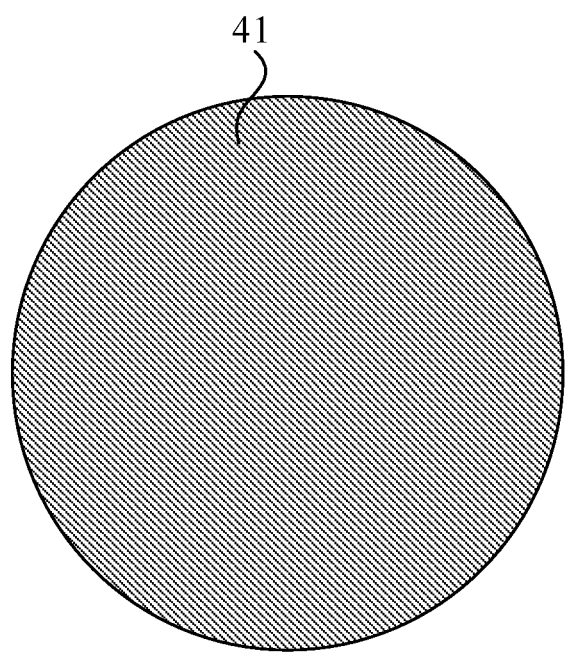
FIG. 3 is a schematic plan view of color resistance in a monochromatic filter structure according to an embodiment of the present disclosure.

FIG. 1 is a schematic plan view of a display module according to an embodiment of the present disclosure, FIG. 2 is a cross-sectional view of the display module shown in FIG. 1 along line A-A', and FIG. 3 is a schematic plan view of color resistance in a monochromatic filter structure according to an embodiment of the present disclosure. Refer to FIG. 1 to FIG. 3, an embodiment of the present disclosure provides a display module. The display module includes a display panel 10 and at least one camera module 20. The display panel 10 includes at least one light-transmitting display area FA. The camera module(s) 20 may be located on the side away from the light-emitting surface of the display panel 10, and the camera module(s) 20 may be arranged corresponding to the light-transmitting display area(s) FA.

In addition to displaying, the light-transmitting display area FA in the display panel 10 may also have a relatively high light transmittance, such that the area corresponding to the light-transmitting display area FA in the display panel 10 can be used to place photosensitive devices. In some embodiments, the photosensitive device may be the camera module 20. In the following description, the photosensitive device is taken as the camera module 20 as an example for illustration, but the photosensitive device is not limited thereto.

It should be noted that, FIG. 1 and FIG. 2 exemplarily show that the display panel 10 includes two light-transmitting display areas FA, and the two light-transmitting display areas FA are discontinuous areas, that is, the two light-transmitting display areas FA are separated by a part AA of a regular display area. In some other embodiments of the present disclosure, the display panel 10 may also include other numbers of light-transmitting display areas FA, and there may also be at least two second display areas 20 in the display panel 10 that are continuous areas, which may be designed and determined based on the actual application environment, which will not be described in detail here.

It should be noted that the light-transmitting display area FA may be a rectangular area, a circular area, an oval area, etc. The position of the light-transmitting display area FA may be arranged on any side of the display panel, and those skilled in the art can arrange the shape and position of the light-transmitting display area FA based on actual needs, which is not limited in the embodiments of the present disclosure.

The camera module 20 in the display module may include a photosensitive element 30 and a filter structure 40. The filter structure 40 may be arranged on the side of the photosensitive element 30 facing the display panel 10. The filter structure 40 may include at least one color resist 41. The color resist 41 may at least partially overlap with the photosensitive element 30 along the direction perpendicular to the plane where the camera module 20 is located. That is, when the external ambient light passes through the light-transmitting display area FA of the display panel 10 and shoots the camera module 20 corresponding to the light-transmitting display area FA, the light may first pass through the filter structure 40, and the color resist 41 in the filter structure 40 may filter the stray light in the light, and then direct the light to the photosensitive element 30, thereby improving the imaging effect of the camera module 20. Of course, in some other embodiments of the present disclosure, the camera module 20 may also include other structures, and details will not be provided here.

In the display module provided by the embodiments of the present disclosure, the filter structure 40 may include a monochrome filter structure 42. The color resists 41 in the monochrome filter structure 42 may have the same color, and at least one camera module 20 may include the monochrome filter structure 42.

Specifically, when external ambient light passes through the light-transmitting display area FA of the display panel 10 and shoots to the camera module 20 corresponding to the light-transmitting display area FA, the light transmittance of each film layer in the display panel 10 will not reach 100%, and the light transmittance of the same film layer of different wavelengths is also different, which may easily cause the amount of light of some wavelengths to be less, such that the light signal of some wavelengths in the optical signal received by the camera module 20 may be reduced, and color distortion is likely to occur during imaging, which affects the imaging effect. In the embodiments of the present disclosure, the display module can be arranged with at least one camera module 20 including a monochrome filter structure 42, and the color resists 41 in the monochrome filter structure 42 may have the same color, which is beneficial to increase the amount of light that is directed to the photosensitive element 30 that has the same color as the color resists 41. In this way, more signals of monochromatic light having the same color as the color resists 41 can be collected by increasing the camera module 20 including the monochrome filter structure 42. Subsequently, the signals collected by the camera module 20 and other camera modules 20 can be algorithmically integrated, and the signals collected by the camera module 20 can compensate the signals of part of the light of certain wavelength in the signals collected by other camera modules 20. In this way, the color distortion of the camera module 20 affecting the imaging effect caused by the lack of light signals of some wavelengths can be effectively alleviated, which is beneficial to improving the imaging effect when taking pictures and improving user experience.

Refer to FIG. 1 to FIG. 3. In some embodiments, the camera module 20 may include at least one first camera module 21, and the first camera module 21 may include a monochrome filter structure 42; the light-transmitting display area FA may include at least one first light-transmitting display area FA1, and the first camera module 21 may be disposed corresponding to the first light-transmitting display area FA1.

Specifically, at least one first light-transmitting display area FA1 may be arranged in the display panel 10, and at least one first camera module 21 may be arranged in the area corresponding to the first light-transmitting display area FA1. The external ambient light may be directed to the first camera module 21 through the first light-transmitting display area FA1, and the first camera module 21 may include the monochrome filter structure 42, such that the photosensitive element 30 in the first camera module 21 can collect more signals of monochromatic light with the same color as the color resist 41 in the monochrome filter structure 42. Subsequently, the signals collected by the first camera module 21 and other camera modules 20 may be algorithmically integrated, and the signals collected by the camera module 20 can compensate the signals of part of the light of certain wavelength in the signals collected by other camera modules 20. In this way, the color distortion of the camera module 20 affecting the imaging effect caused by the lack of light signals of some wavelengths can be effectively alleviated.

It should be noted that FIG. 1 and FIG. 2 only exemplarily show that the display panel 10 includes one first light-transmitting display area FA1, and the area corresponding to the first light-transmitting display area FA1 is only arranged with one first camera module 21. In some other embodiments of the present disclosure, the display panel 10 may also include other numbers of first light-transmitting display areas FA1, and the areas corresponding to the first light-transmitting display areas FA1 may be provided with two or more first camera modules 21, which will not be described in detail here.

Figure 4:
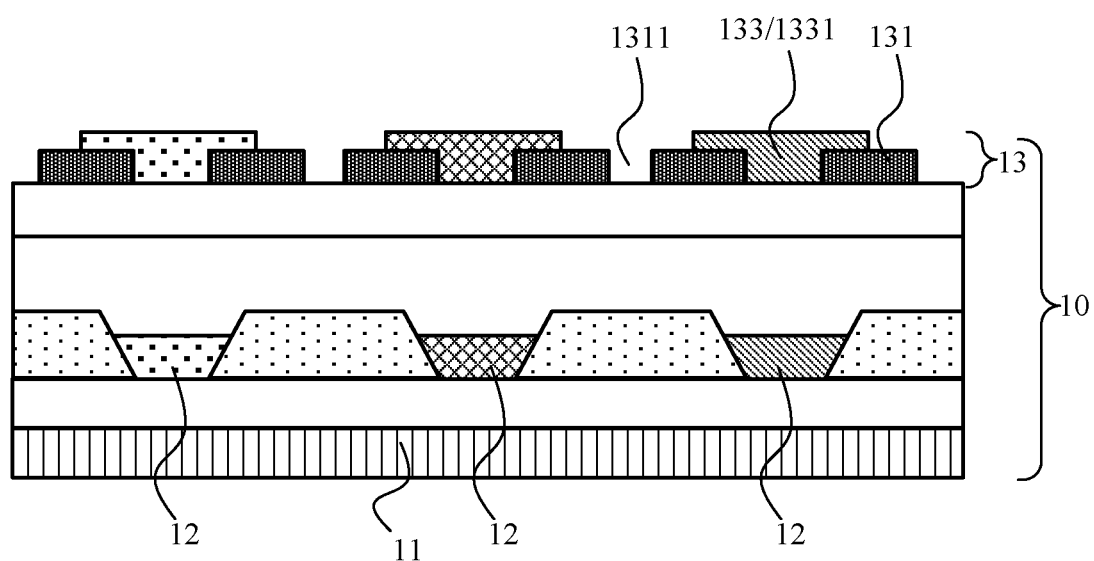
FIG. 4 is a partial cross-sectional view of a first light-transmitting display area in a display panel according to an embodiment of the present disclosure.

FIG. 4 is a partial cross-sectional view of a first light-transmitting display area in a display panel according to an embodiment of the present disclosure. Refer to FIG. 1 to FIG. 4, In some embodiments, the display panel 10 may include a substrate 11. The substrate 11 may be disposed on the side of the display panel 10 facing the camera module 20, and the material of the substrate 11 may include polyimide.

Specifically, the transmittance of polyimide to long-wavelength light is greater than its transmittance to short-wavelength light, that is, the transmittance to blue light is relatively low, that is, there are less blue light signal in the light directed to the camera module 20, which can easily cause color distortion of the camera module 20 during imaging, which affects the imaging effect.

In some embodiments, the light-transmitting display area FA in the display panel 10 may include a plurality of high light-transmitting film layers (not shown in the accompanying drawings) to improve the light transmittance of the light-transmitting display area FA. The high light-transmitting film layer mostly adopts an organic film layer, and the transmittance of the organic film layer to long-wavelength light is greater than its transmittance to short-wavelength light, that is, the transmittance to blue light is relatively low, which further reduces the signal of the blue light in the light directed to the camera module 20, such that color distortion can easily occur when the camera module 20 is imaging, which affects the imaging effect.

Refer to FIG. 1 to FIG. 3. In some embodiments, the color resist 41 in the monochrome filter structure 42 may be a blue color resist.

Specifically, since the signal of the blue light in the light directed to the camera module 20 is limited, the first camera module 21 can be arranged in the display module, and the color resist in the monochrome filter structure 42 in the first camera module 21 can be a blue resist, such that the photosensitive element 30 in the first camera module 21 can collect more blue light signals. Subsequently, the signals collected by the first camera module 21 and other camera modules 20 can be algorithmically integrated, and the signals collected by can compensate the blue light signals collected by other camera modules 20. In this way, the color distortion of the camera module 20 during imaging caused by limited blue light signals, which affects the imaging effect, can be effectively alleviated.

It should be understood that the embodiment of the present disclosure exemplarily shows that when the transmittance of some film layers in the display panel 10 to blue light is relatively low, the color resist in the monochrome filter structure 42 in the first camera module 21 can be arranged to be blue light resist. Similarly, in some other embodiments of the present disclosure, when the transmittance of some film layers in the display panel 10 to light of other colors is relatively low, the color resist 41 in the monochrome filter structure 42 in the first camera module 21 may be arranged as the color resist of the corresponding color. For example, when the transmittance of some film layers in the display panel 10 to green light is relatively low, the color resist 41 in the monochrome filter structure 42 in the first camera module 21 can be arranged as a green color resist, which will not be described in detail here.

Refer to FIG. 1. In some embodiments, the camera module(s) 20 may be arranged in a straight line.

Specifically, two camera modules 20 can be arranged in a straight line, that is, the camera modules 20 can be arranged along a single direction, such that when the camera modules 20 are arranged in the display module, it is only necessary to consider whether the distance along a certain direction can accommodate multiple camera modules 20. In addition, the corresponding light-transmitting display areas FA can also be arranged along a single direction, and only the spacing design between the light-transmitting display areas FA in the display panel 10 in a single direction needs to be considered, and there is no need to consider the spacing design between the light-transmitting display areas FA and other light-transmitting display areas FA in multiple directions, thereby simplifying the design and reducing the production costs.

It should be noted that the arrangement direction of the camera modules 20 can be any direction parallel to the plane where the display panel 10 is located. Those skilled in the art can set the arrangement direction of the camera modules 20 and the spacing between the camera modules 20 based on actual needs, which is not specifically limited in the embodiments of the present disclosure.

Figure 5:
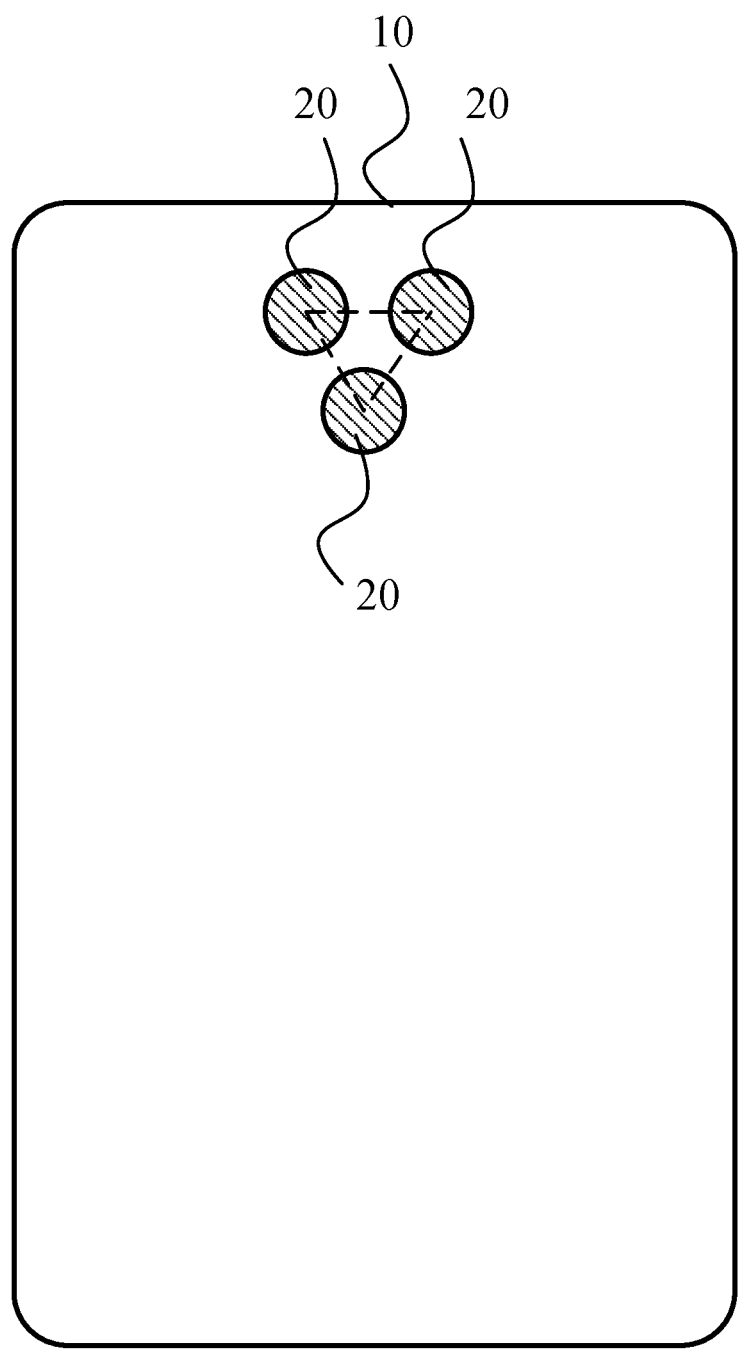
FIG. 5 is a bottom view of another display module according to an embodiment of the present disclosure.

FIG. 5 is a bottom view of another display module according to an embodiment of the present disclosure. Refer to FIG. 5. In some embodiments, the number of camera modules 20 may be n, n≥3 and n being an integer; n camera modules 20 may not be arranged on the same straight line; along the direction parallel to the plane where the display panel 10 is located, the linear distances of at least one camera module 20 in the n camera modules 20 between at least two adjacent camera modules 20 may be the same.

Specifically, three or more camera modules 20 may be arranged in the display module, and the camera modules 20 in the display module may not be arranged in a single direction, and along the direction parallel to the plane where the display panel 10 is located, there may be at least one camera module 20 in the display module that the distances between at least two adjacent camera modules 20 are the same. In this way, it is convenient to integrate the signals collected by the camera module 20 and its adjacent camera modules 20 through an algorithm, which is beneficial to simplifying the algorithm.

It should be noted that the distances between one camera module 20 and its adjacent camera modules 20 may refer to the distances between the centers of the two camera modules 20. In other embodiments of the present disclosure, related description is also applicable, which will not be repeated.

In some embodiments, the number of camera modules 20 may be three, and the three camera modules 20 may be arranged in an equilateral triangle, such that the distances between two adjacent camera modules 20 can be the same. In this way, it is convenient to integrate the signals collected by each camera module 20 through an algorithm, which is beneficial to simplifying the algorithm.

Figure 6:
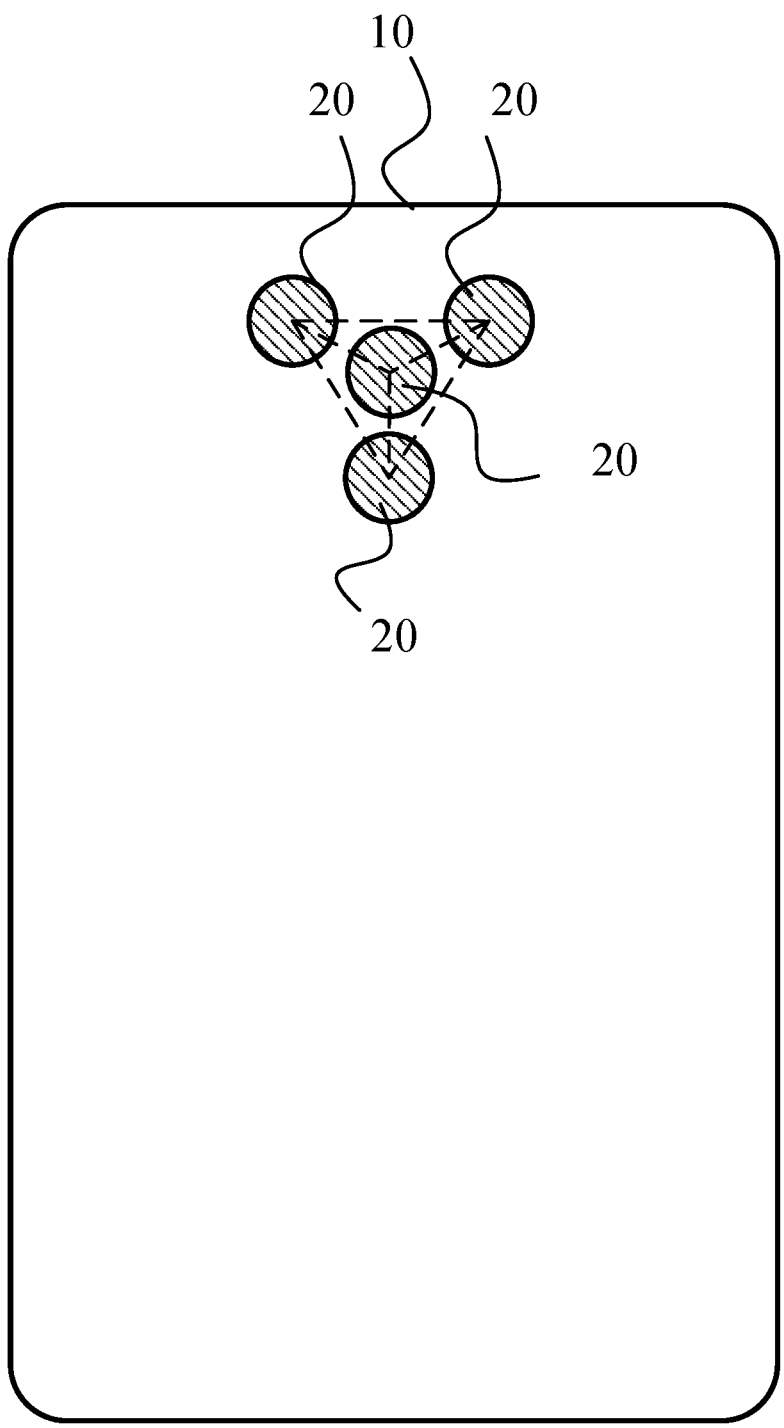
FIG. 6 is a bottom view of another display module according to an embodiment of the present disclosure.

FIG. 6 is a bottom view of another display module according to an embodiment of the present disclosure. Refer to FIG. 6. In some embodiments, the display module may include four or more camera modules 20, and the distances between one camera module 20 and its adjacent camera modules 20 may be the same. That is, a plurality of camera modules 20 may be arranged around one camera module 20, the distances between the camera module 20 arranged in the center and the camera modules 20 adjacent to it may be the same, and the distances between the camera modules 20 adjacent to the camera module 20 arranged in the center may also be the same. In this way, it is convenient to integrate the signals collected by the camera module 20 arranged in the center and the camera modules 20 adjacent to it through an algorithm, and it is convenient to integrate the signals collected by the camera modules 20 adjacent to the camera module 20 arranged in the center through the algorithm, which is beneficial to simplifying the algorithm.

It should be noted that, with reference to the arrangement of the camera modules 20 in the above embodiment, those skilled in the art can set the arrangement of the camera modules 20 and the distances between the camera modules 20 based on actual needs, which will not be described in detail here.

Refer to FIG. 1 to FIG. 4. In some embodiments, the display panel 10 may include a plurality of light-emitting units 12. The display panel 10 may be an organic light-emitting display panel, and the light-emitting unit 12 in the display panel 10 may be an organic light-emitting unit, which is used to realize the normal display of the display panel 10. Of course, in other embodiments of the present disclosure, the display panel 10 may also be other types of display panels. Correspondingly, the light-emitting unit 12 in the display panel 10 may also be other types of light-emitting units, and those skilled in the art can make the arrangement based on actual needs, which will not be described in detail here.

The display panel 10 may also include various functional film layers related to the pixel driving circuit used to drive the light-emitting unit 12. The pixel driving circuit may include thin film transistors, storage capacitors, and other circuit elements known to those skilled in the art. For example, take a thin film transistor as an example, the array layer may include an active layer, a gate insulating layer, a gate layer, an interlayer insulating layer, a source-drain layer, and other film layers known to those skilled in the art.

The display panel 10 may also include a filter layer 13, and the filter layer 13 may be disposed on a side of the light-emitting unit 12 facing the light-emitting surface of the display panel 10.

In the first light-transmitting display area FA1, the filter layer 13 may include a light-shielding part 131, and at least part of the light-shielding part 131 may include a gap 1311. Along the direction perpendicular to the plane where the display panel 10 is located, the gap 1311 may be located between the adjacent light-emitting units 12, and the gap 1311 may run through the light-shielding part 131. External ambient light can enter the display panel 10 through the gap 1311, which is beneficial to increasing the light transmittance of the first light-transmitting display area FA1 in the display panel 10, that is, to increase the amount of light directed to the first camera module 21. Correspondingly, it is beneficial to increase the amount of light that is consistent with the color of the color resist 41 in the monochrome filter structure 42 directed to the first camera module 21, and it is beneficial for the first camera module 21 to collect the signals of the light with the same color as the color resist 41 in the monochrome filter structure 42.

Figure 7:
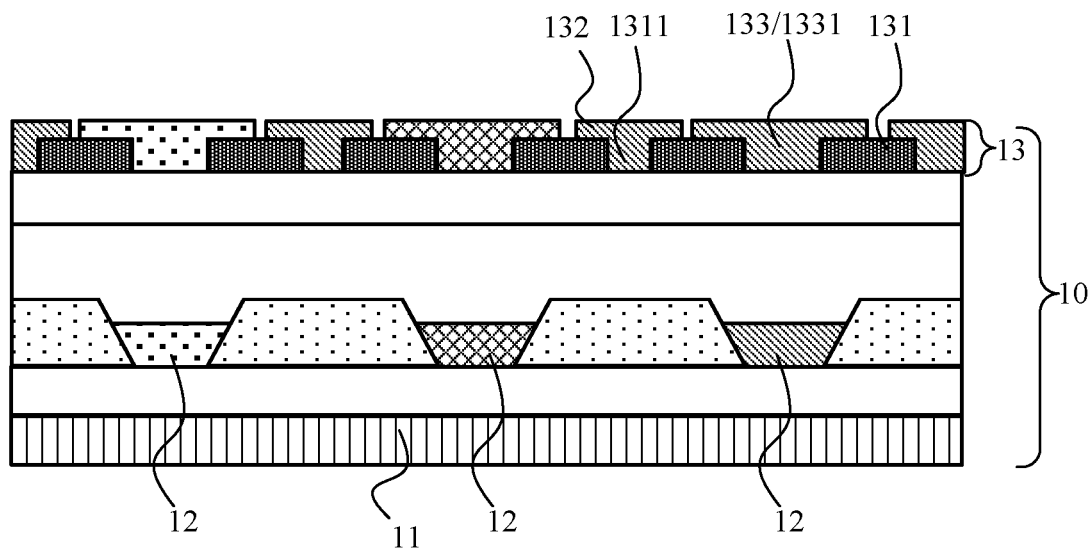
FIG. 7 is another partial cross-sectional view of the first light-transmitting display area in the display panel according to an embodiment of the present disclosure.

FIG. 7 is another partial cross-sectional view of the first light-transmitting display area in the display panel according to an embodiment of the present disclosure. Refer to FIG. 1-FIG. 3, and FIG. 7. In some embodiments, in the first light-transmitting display area FA1, the filter layer 13 may include a first color resist 132, and the first color resist 132 may fill at least part of the gap 1311. In some embodiments, the color of the first color resist 132 may be consistent with the color of the color resist 41 in the monochrome filter structure 42.

Specifically, in the first light-transmitting display area FA1, at least part of the gap 1311 may be filled with the first color resist 132, and the color of the first color resist 132 may be consistent with the color of the color resist 41 in the monochrome filter structure 42. When external ambient light passes through the first color resist 132 and shoots to the first camera module 21, the first color resist 132 may filter the light except for the light of the same color as the color resist 41 in the monochrome filter structure 42, thereby preventing the light of other colors from affecting the first camera module 21 to collect the signals of the light with the same color as the color resist 41 in the monochrome filter structure 42, which is beneficial for the first camera module 21 to collect the signal of the light with the same color as the color resist 41 in the monochrome filter structure 42. Therefore, when the signals collected by the first camera module 21 and other camera modules 20 are integrate algorithmically, it is beneficial for the signals collected by the first camera module 21 to compensate the signals of part of the wavelength of light in the signals collected by other camera modules 20. In this way, the color distortion of the camera module 20 that affects the imaging effect caused by limited signals of part of the wavelength of light when imaging can be effectively alleviated.

For example, the color resist 41 in the monochrome filter structure 42 may be a blue color resist, and the first color resist 132 may also be a blue color resist, such that when the external ambient light passes through the first color resist 132 to the first camera module 21, the first color resist 132 can filter the light except the blue light, thereby preventing the light of other colors from affecting the collection of the signals of the blue light by the first camera module 21, which is beneficial to the collection of the signals of the blue light by the first camera module 21. Therefore, when there are few signals of blue light in the signals collected by other camera modules 20, the blue light signals collected by the first camera module 21 can effectively compensate for the missing blue light signals in the signals collected by other camera modules 20, thereby effectively improving the imaging effect and improving the user experience.

Figure 8:
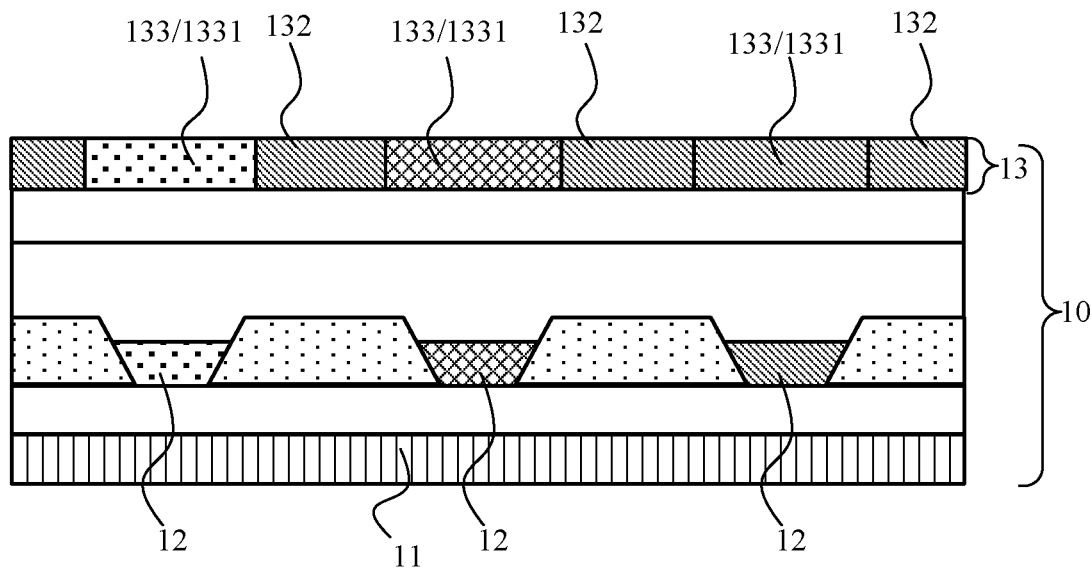
FIG. 8 is another partial cross-sectional view of the first light-transmitting display area in the display panel according to an embodiment of the present disclosure.

FIG. 8 is another partial cross-sectional view of the first light-transmitting display area in the display panel according to an embodiment of the present disclosure. Refer to FIG. 1-FIG. 3, and FIG. 8. In some embodiments, the display panel 10 may include a plurality of light-emitting units 12. The display panel 10 may be an organic light-emitting display panel, and the light-emitting unit 12 in the display panel 10 may be an organic light-emitting unit, which is used to realize the normal display of the display panel 10.

The display panel 10 may also include a filter layer 13, and the filter layer 13 may be disposed on a side of the light-emitting unit 12 facing the light-emitting surface of the display panel 10.

In the first light-transmitting display area FA1, the filter layer 13 may include a second color resist 133, and the second color resist 133 may include a plurality of color resists 1331 having the same color as the light-emitting unit 12. The color resists 1331 may be arranged in an array along a direction parallel to the plane where the display panel 10 is located. In addition, along the direction perpendicular to the plane where the display panel 10 is located, the second color resist 133 may at least partially overlap with the light-emitting unit 12 of the same color. The light emitted by the light-emitting unit 12 may be emitted through the second color resist 133 of the same color for the first light-transmitting display area FA1 to display normally.

In some embodiments, the light-emitting unit 12 may include a red light-emitting unit, a green light-emitting unit, and a blue light-emitting unit. Correspondingly, the second color resist 133 may include the red color resist, the green color resist, and the blue color resist, and the red color resists may be arranged corresponding to the red light-emitting unit, the green color resists may be arranged corresponding to the green light-emitting unit, and the blue color resists may be arranged corresponding to the blue light-emitting unit. It should be understood that the light-emitting unit 12 may also include light-emitting units of other colors, and the corresponding second color resist 133 may also include a color resist of the same color.

In the first light-transmitting display area FA1, the filter layer 13 may include the first color resist 132, and along the direction perpendicular to the plane where the display panel 10 is located, the first color resist 132 may be located between adjacent light-emitting units 12. In some embodiments, along the direction parallel to the plane where the display panel 10 is located, the first color resist 132 may be adjacent to the second color resist 133, and the color of the first color resist 132 may be consistent with the color of the color resist 41 in the monochrome filter structure 42. That is, no light-shielding part may be provided between adjacent second color resists 133, thereby increasing the amount of light on the first camera module 21. At the same time, the first color resist 132 may be arranged between adjacent second color resists 133, such that when the external ambient light passes through the first color resist 132 and shoots to the first camera module 21, the first color resist 132 may filter the light other than the light having the same color as the color resist 41 in the monochrome filter structure 42, which is beneficial to increasing the amount of light that is consistent with the color of the color resist 41 in the monochrome filter structure 42 directed to the first camera module 21.

Refer to FIG. 7. External light is emitted into the display panel 10, and after being reflected by a metal layer (not shown in the accompanying drawings) in the display panel 10, it will be emitted from the light-emitting side of the display panel 10, and then crosstalk with the light emitted by the light-emitting unit 12, thereby affecting the display effect. The arrangement of the light-shielding part 131 can absorb the light reflected by the metal layer (not shown in the accompanying drawings), reduce the crosstalk between such light and the light emitted by the light-emitting unit 12 to improve the display effect. However, at the same time, the disposition of the light-shielding part 131 will reduce the light emitted to the camera module through the filter layer 13 and affect the transmittance of the light-transmitting display area. Therefore, in this embodiment of the present disclosure, no light-shielding part is provided between adjacent second color resists 133, and the first color resist 132 is provided between adjacent second color resists 133, which is beneficial to increasing the amount of light having the same color as the color resist 41 in the monochrome filter structure 42 and is directed to the first camera module 21, which is beneficial for the first camera module 21 to collect the signals of the light with the same color as the color resist 41 in the monochrome filter structure 42. At the same time, on the one hand, the arrangement of the first color resist 132 may absorb part of the light reflected by the metal layer (not shown in the accompanying drawings), which, to a certain extent, plays the role of reducing crosstalk with the light emitted by the light-emitting unit 12; on the other hand, light of other colors can be prevented from affecting the first camera module 21 to collect the signals of the light with the same color as the color resist 41 in the monochrome filter structure 42. Therefore, when the signals collected by the first camera module 21 and other camera modules 20 are integrate algorithmically, it is beneficial for the signals collected by the first camera module 21 to compensate the signals of part of the wavelength of light in the signals collected by other camera modules 20. In this way, the color distortion of the camera module 20 that affects the imaging effect caused by limited signals of part of the wavelength of light when imaging can be effectively alleviated.

For example, the color resist 41 in the monochrome filter structure 42 may be a blue color resist, and the first color resist 132 may also be a blue color resist, such that when the external ambient light passes through the first color resist 132 to the first camera module 21, the first color resist 132 can filter the light except the blue light, thereby preventing the light of other colors from affecting the collection of the signals of the blue light by the first camera module 21. At the same time, by not arranging the light-shielding part between adjacent second color resists 133 and arranging the first color resist 132 between adjacent second color resists 133, the amount of blue light directed to the first camera module 21 can be increased, thereby further facilitating the collection of blue light signals for the first camera module 21. Therefore, when there are few signals of blue light in the signals collected by other camera modules 20, the blue light signals collected by the first camera module 21 can effectively compensate for the missing blue light signals in the signals collected by other camera modules 20, thereby effectively improving the imaging effect and improving the user experience.

Figure 9:
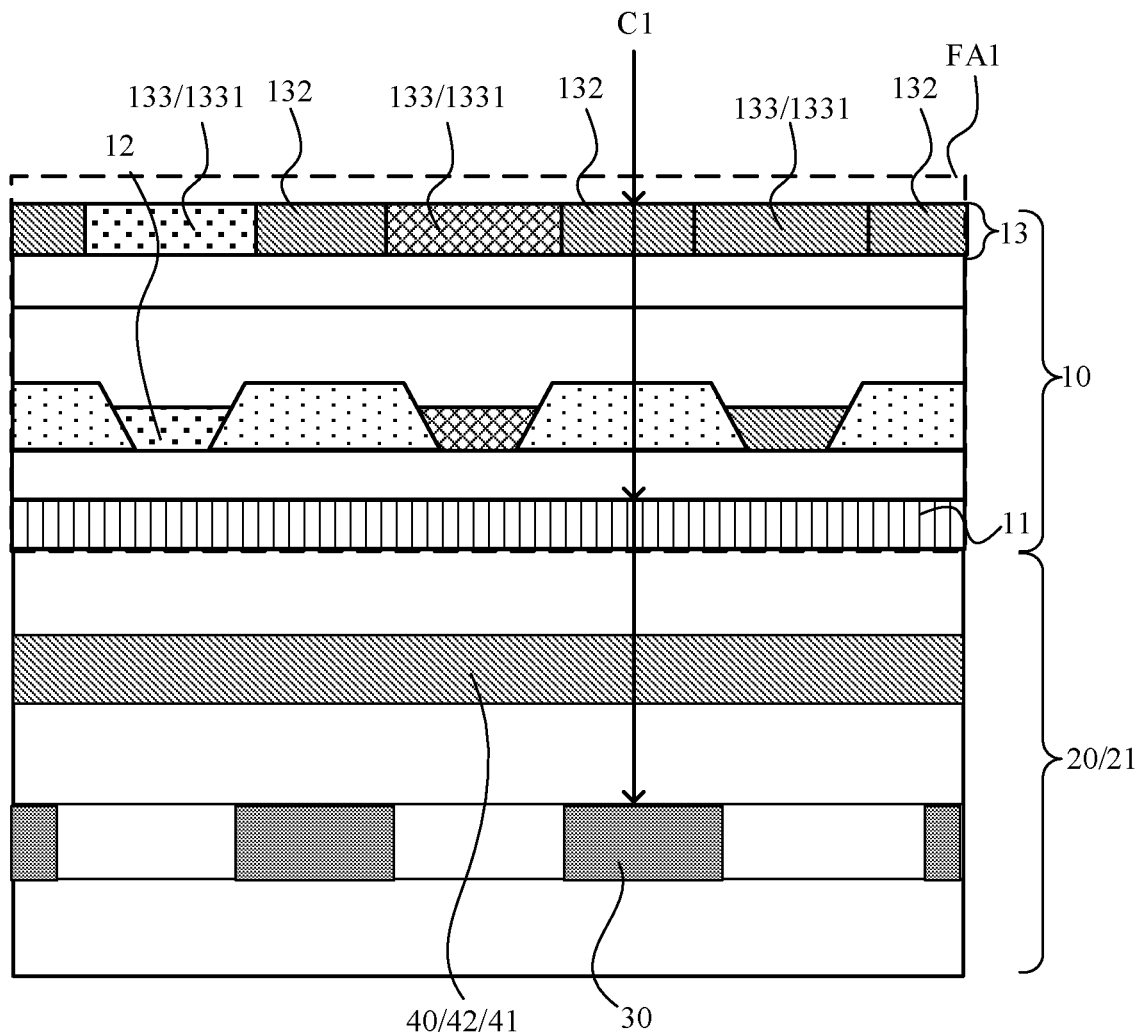
FIG. 9 is a partial structural schematic diagram of an area corresponding to the first light-transmitting display area in another display module according to an embodiment of the present disclosure.

FIG. 9 is a partial structural schematic diagram of an area corresponding to the first light-transmitting display area in another display module according to an embodiment of the present disclosure. Refer to FIG. 9. In some embodiments, along the direction perpendicular to the plane where the display panel 10 is located, at least part of the first color resist 132 and the color resist 41 in the monochrome filter structure 42 may at least partially overlap. That is, in the first light-transmitting display area FA1 and in the area corresponding to the color resist 41 in the monochrome filter structure 42, the first color resist 132 may be arranged between adjacent second color resists 133, which is beneficial to increasing the amount of light that is consistent with the color of the color resist 41 in the monochrome filter structure 42, which is beneficial for the first camera module 21 to collect the light signals of the same color as the color resist 41 in the monochrome filter structure 42.

Refer to FIG. 9. For example, part of light C1 with the same color as the color resist 41 in the monochrome filter structure 42 may pass through the first color resist 132, and then light C1 may further pass through the color resist 41 in the monochrome filter structure 42, and final hit the photosensitive element 30 in the first camera module 21. In this way, the photosensitive element 30 in the first camera module 21 can collect the signal of light C1 having the same color as the color resist 41 in the monochrome filter structure 42.

Figure 10:
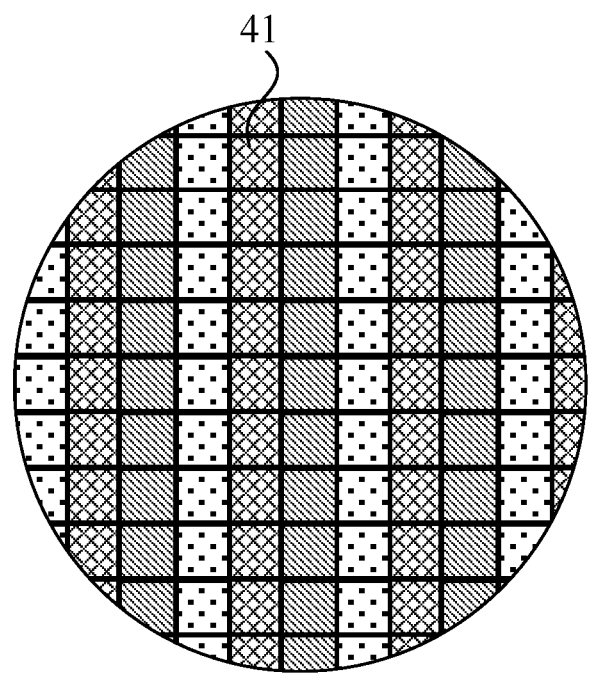
FIG. 10 is schematic plan view of color resistance in a color filter structure according to an embodiment of the present disclosure.

FIG. 10 is schematic plan view of color resistance in a color filter structure according to an embodiment of the present disclosure. Refer to FIG. 1, FIG. 2, and FIG. 10. In some embodiments, the light-transmitting display area FA may include at least one second light-transmitting display area FA2.

In some embodiments, the camera module 20 may include at least one second camera module 22, and the second camera module 22 may be arranged corresponding to the second light-transmitting display area FA2.

The filter structure 40 in the second camera module 22 may be a color filter structure 43. The color filter structure 43 may include three or more color resists 41 of different colors, and the color resists 41 may be arranged in an array along a direction parallel to the plane where the filter structure 40 is located.

Specifically, at least one second light-transmitting display area FA2 may be arranged in the display panel 10. Correspondingly, at least one second camera module 22 may be arranged in the area corresponding to the second light-transmitting display area FA2, and external ambient light may be irradiated to the second camera module 22 through the second light-transmitting display area FA2. The second camera module 22 may include a color filter structure 43. The color filter structure 43 may include three or more color resists 41 of different colors, and the color resists 41 may be arranged in an array along a direction parallel to the plane where the filter structure 40 is located for the photosensitive element 30 in the second camera module 22 to collect light signals of various colors.

Since the light transmittance of each film layer in the display panel 10 will not reach 100%, and the transmittance of the same film layer for light of different wavelengths is also different, it is easy to cause the amount of light of some wavelengths to be reduced, and the light signals of some wavelengths in the optical signals received by the second camera module 22 to be reduced. In this case, imaging is performed only through the optical signals received by the second camera module 22, and color distortion is prone to occur during imaging, which affects the imaging effect. At this time, the signals collected by the first camera module 21 and the second camera module 22 can be algorithmically integrated, and the signals collected by the first camera module 21 can be used to compensate the light signals of some wavelengths in the signals collected by the second camera module 22. In this way, the color distortion of the camera module 22 that affects the imaging effect caused by limited light signals of some wavelengths when imaging can be effectively alleviated.

It should be noted that, FIG. 1 and FIG. 2 only exemplarily show that the display panel 10 includes one second light-transmitting display area FA2, and the area corresponding to the second light-transmitting display area FA2 is only provided with one second camera module 22. In some other embodiments of the present disclosure, the display panel 10 may include other numbers of second light-transmitting display areas FA2, and the areas corresponding to the second light-transmitting display areas FA2 may be provided with two or more second camera modules 22, which will not be described in detail here.

Figure 11:
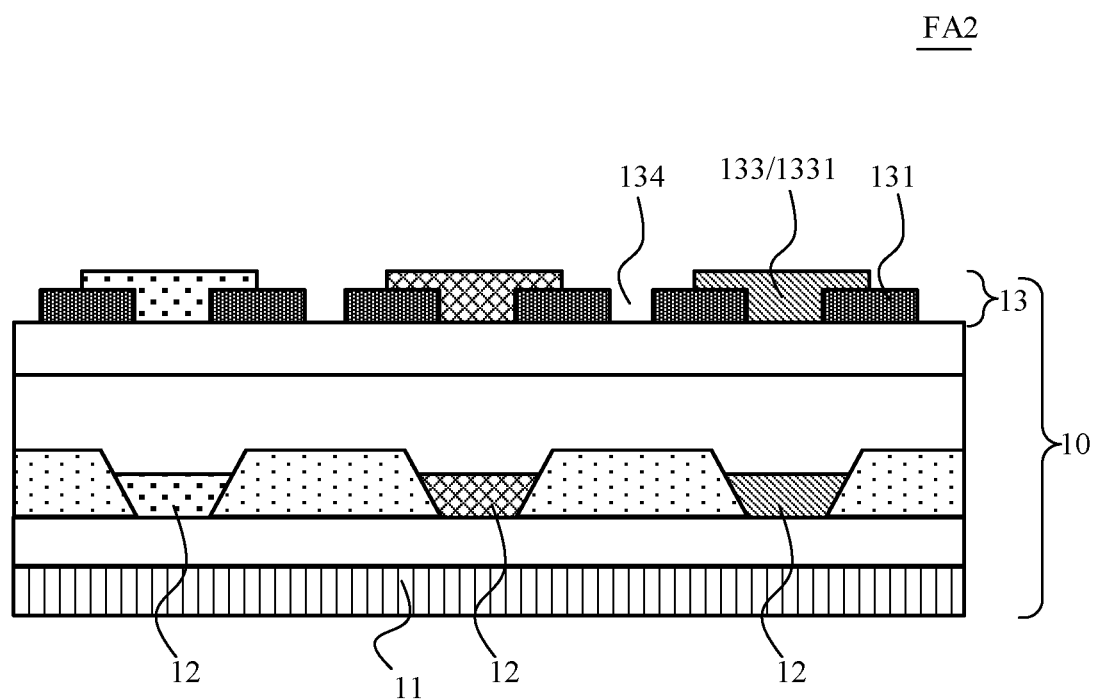
FIG. 11 is a partial cross-sectional view of a second light-transmitting display area in the display panel according to an embodiment of the present disclosure.

FIG. 11 is a partial cross-sectional view of a second light-transmitting display area in the display panel according to an embodiment of the present disclosure. Refer to FIG. 1, FIG. 2, FIG. 9, and FIG. 11. In some embodiments, the display panel 10 may include a plurality of light-emitting units 12. The display panel 10 may be an organic light-emitting display panel, and the light-emitting unit 12 in the display panel 10 may be an organic light-emitting unit, which is used to realize the normal display of the display panel 10.

The display panel 10 may also include a filter layer 13, and the filter layer 13 may be disposed on a side of the light-emitting unit 12 facing the light-emitting surface of the display panel 10.

In the second light-transmitting display area FA2, the filter layer 13 may include a second color resist 133, and the second color resist 133 may include a plurality of color resists 1331 having the same color as the light-emitting unit 12. The color resists 1331 may be arranged in an array along a direction parallel to the plane where the display panel 10 is located. In addition, along the direction perpendicular to the plane where the display panel 10 is located, the second color resist 133 may at least partially overlap with the light-emitting unit 12 of the same color. The light emitted by the light-emitting unit 12 may be emitted through the second color resist 133 of the same color for the second light-transmitting display area FA2 to display normally.

In the second light-transmitting display area FA2, the filter layer 13 may also include a light-transmitting area 134. The light-transmitting area 134 may be located between adjacent second color resists 133 along a direction parallel to the plane where the display panel 10 is located. In some embodiments, at least part of the light-transmitting area 134 may be at least partially overlap with at least part of the color resist 41 in the color filter structure 43.

Specifically, external ambient light may enter the display panel 10 through the light-transmitting area 134, which is beneficial to increasing the light transmittance of the second light-transmitting display area FA1 in the display panel 10, that is, to increase the amount of light directed to the second camera module 22. Correspondingly, it is beneficial to increase the amount of light directed to the second camera module 22, which is beneficial to the collection of light signals by the second camera module 22.

Figure 12:
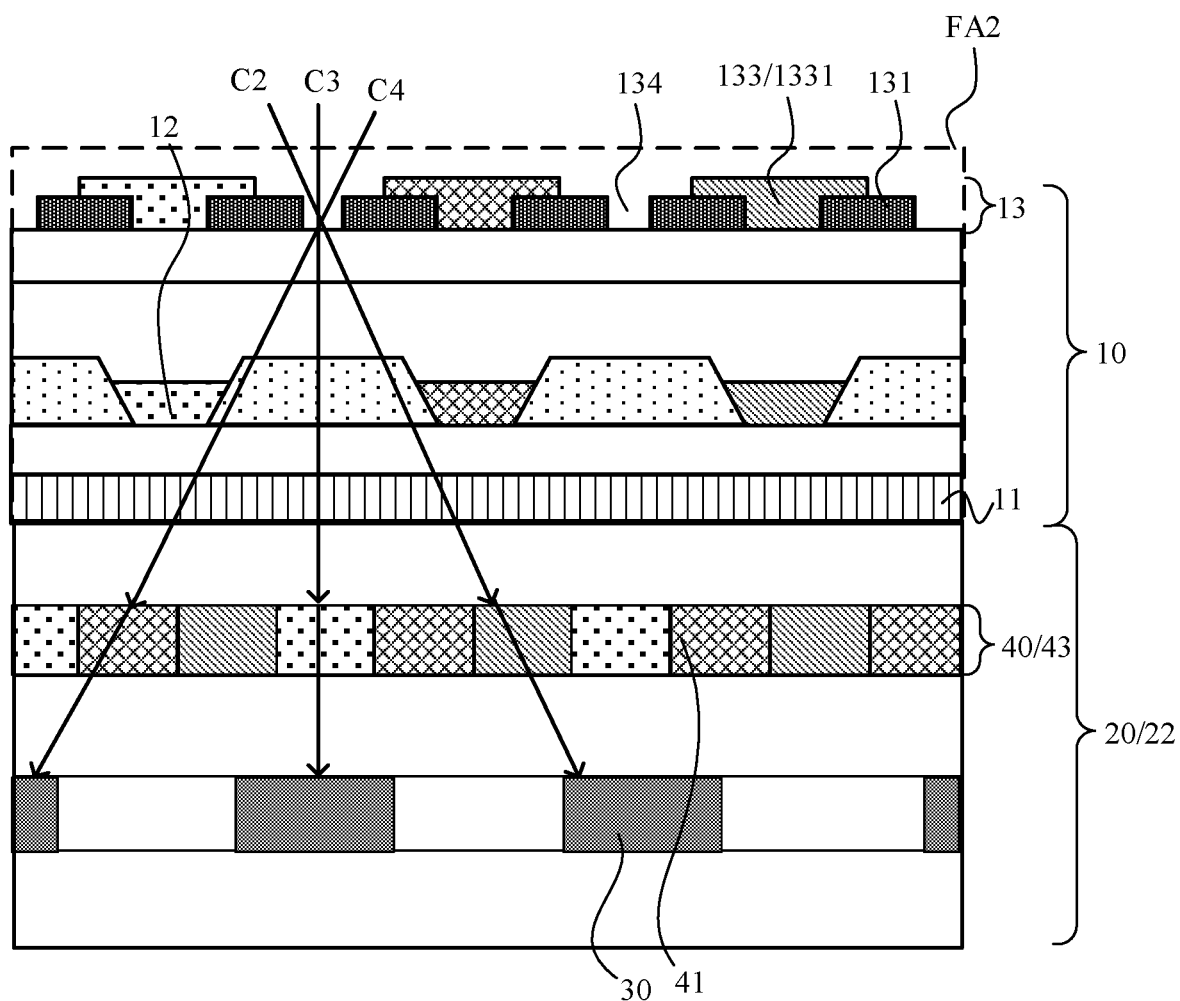
FIG. 12 is a partial structural schematic diagram of an area corresponding to the second light-transmitting display area in another display module according to an embodiment of the present disclosure.

Refer to FIG. 12, which is a partial structural schematic diagram of an area corresponding to the second light-transmitting display area in another display module according to an embodiment of the present disclosure. Lights C2, C3, and C4 of different colors can pass through the light-transmitting area 134, and then light C1 of different colors can further pass through the color resist 41 of the same color in the color filter structure 43, and finally emits to the photosensitive element 30 in the second camera module 22. In this way, the photosensitive element 30 in the second camera module 22 can collect the signals of lights C2, C3, and C4 of different colors.

Figure 13:
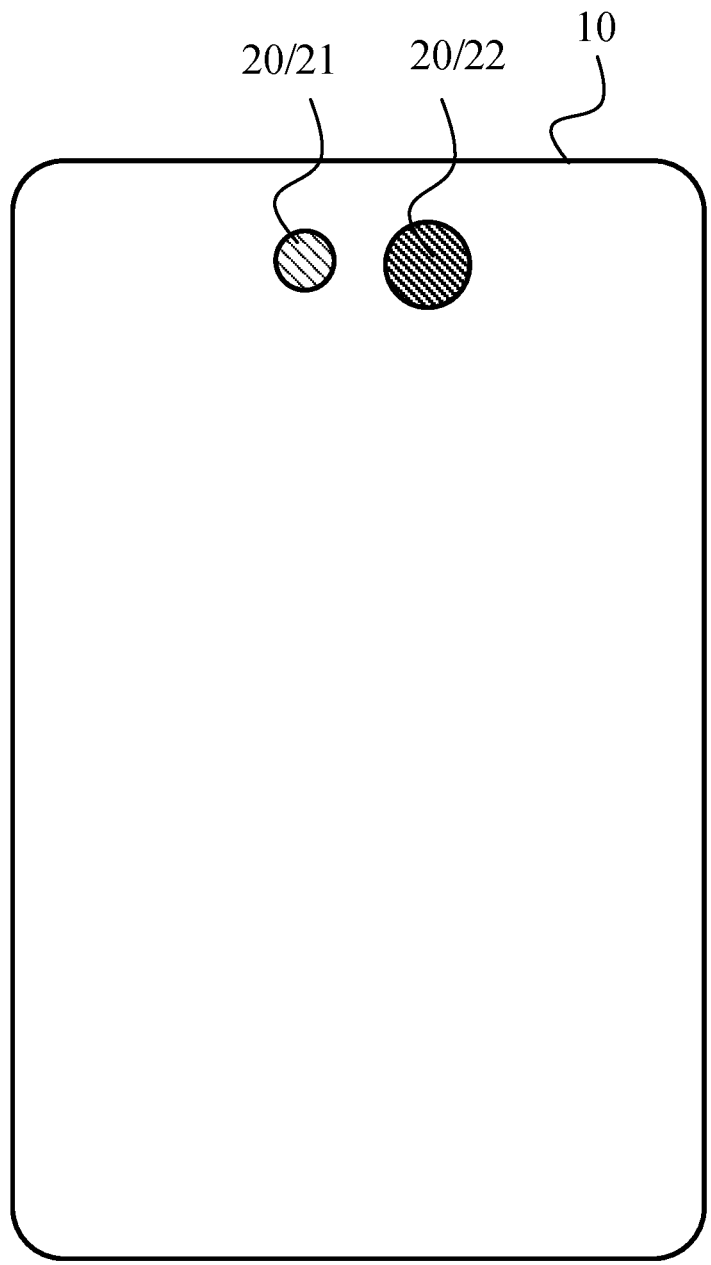
FIG. 13 is a bottom view of another display module according to an embodiment of the present disclosure.

FIG. 13 is a bottom view of another display module according to an embodiment of the present disclosure. Refer to FIG. 13. In some embodiments, along the direction perpendicular to the plane where the display panel 10 is located, the projected area of the first camera module 21 on the display panel 10 may be S1, the projected area of the second camera module 22 on the display panel 10 may be S2, and $S1 = \frac{1}{3} S2$.

Specifically, since the light transmittance of each film layer in the display panel 10 will not reach 100%, and the transmittance of the same film layer for light of different wavelengths is also different, it is easy to cause the amount of light of some wavelengths to be reduced, and the light signals of some wavelengths in the optical signals received by the second camera module 22 to be reduced. In this case, imaging is performed only through the optical signals received by the second camera module 22, and color distortion is prone to occur during imaging, which affects the imaging effect. At this time, the signals collected by the first camera module 21 and the second camera module 22 can be algorithmically integrated, and the signals collected by the first camera module 21 can be used to compensate the light signals of some wavelengths in the signals collected by the second camera module 22. In this way, the color distortion of the camera module 22 that affects the imaging effect caused by limited light signals of some wavelengths when imaging can be effectively alleviated.

The color filter structure corresponding to the photosensitive element in the second camera module 22 is generally provided with color resists of three different colors. The signals collected by the first camera module 21 can be used to compensate the light signals of a certain color in the signals collected by the second camera module 22. Therefore, the monochrome filter structure corresponding to the photosensitive element in the first camera module 21 may only be provided with a color resist of one color. In this way, when the projected area of the first camera module 21 on the display panel 10 is one third of the projected area of the second camera module 22 on the display panel 10, the signals of a certain color in the signals collected by the second camera module 22 can be better compensated. At the same time, reducing the projected area of the first camera module 21 on the display panel 10 is beneficial to increasing the display area of the normal display area of the display panel 10 and improving the display effect.

Figure 14:
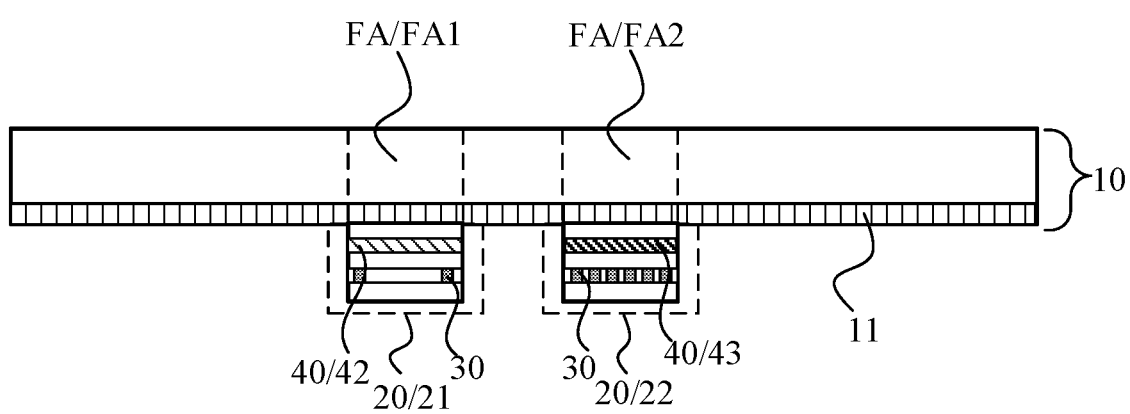
FIG. 14 is another cross-sectional view of the display module shown in FIG. 1 along line A-A'.

FIG. 14 is another cross-sectional view of the display module shown in FIG. 1 along line A-A'. Refer to FIG. 1 and FIG. 14. In some embodiments, along the direction parallel to the plane where the display panel 10 is located, the number of photosensitive elements 30 included in the unit area of the first camera module 21 may be one third of the number of photosensitive elements 30 included in the unit area of the second camera module 22.

Specifically, since the light transmittance of each film layer in the display panel 10 will not reach 100%, and the transmittance of the same film layer for light of different wavelengths is also different, it is easy to cause the amount of light of some wavelengths to be reduced, and the light signals of some wavelengths in the optical signals received by the second camera module 22 to be reduced. In this case, imaging is performed only through the optical signals received by the second camera module 22, and color distortion is prone to occur during imaging, which affects the imaging effect. At this time, the signals collected by the first camera module 21 and the second camera module 22 can be algorithmically integrated, and the signals collected by the first camera module 21 can be used to compensate the light signals of some wavelengths in the signals collected by the second camera module 22. In this way, the color distortion of the camera module 22 that affects the imaging effect caused by limited light signals of some wavelengths when imaging can be effectively alleviated.

The color filter structure 43 corresponding to the photosensitive element 30 in the second camera module 22 is generally provided with color resists of three different colors. In the second camera module 22, the photosensitive element 30 needs to collect the light signals of three colors, and the signals collected by the photosensitive element 30 in the first camera module 21 can be used to compensate the light signals of a certain color in the signals collected by the photosensitive element 30 in the second camera module 22. Therefore, the first camera module 21 and the photosensitive element 30 only need to collect the light signals of one color. Along the direction parallel to the plane where the display panel 10 is located, when the number of photosensitive elements 30 included in the unit area of the first camera module 21 is one third of the number of photosensitive elements 30 included in the unit area of the second camera module 22, the light signals of a certain color collected by the photosensitive elements 30 in the first camera module 21 can be used to compensate the light signals of a certain color in the signals collected by the photosensitive elements 30 in the second camera module 22. At the same time, reducing the number of photosensitive elements 30 in the first camera module 21 can reduce production costs. In addition, by reducing the number of photosensitive elements 30 in the first camera module 21, on the one hand, the adjustment of the size of the first camera module 21 is not restricted, which is beneficial to reducing the size of the first camera module 21; on the other hand, without changing the area of the first camera module 21, the number of photosensitive elements 30 is reduced, such that the film layer for arranging the photosensitive elements 30 has more vacant positions. In this way, there can be more space to optimize the arrangement of the photosensitive elements 30, such that the photosensitive elements 30 can match the first color resist or gap in the filter layer 13 of the display panel 10, thereby increasing the amount of external light directed to the photosensitive elements 30 through the first color resist or the gap, which is beneficial to the collection of light signals by the first camera module 21.

Figure 15:
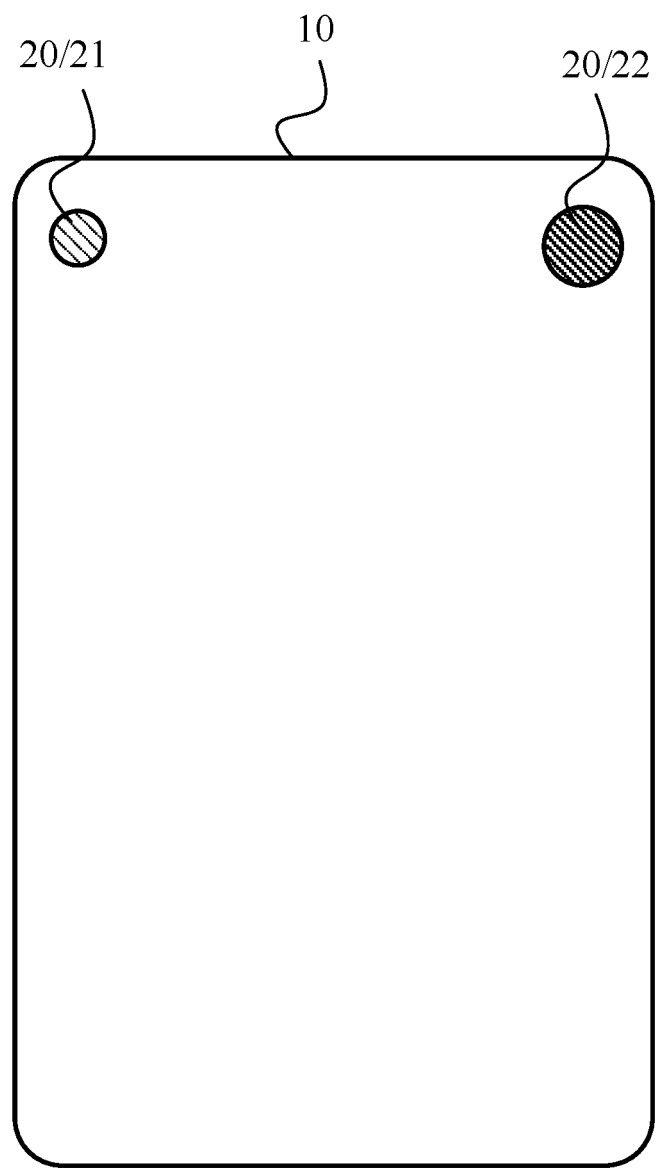
FIG. 15 is a bottom view of another display module according to an embodiment of the present disclosure.

FIG. 15 is a bottom view of another display module according to an embodiment of the present disclosure. Refer to FIG. 15. In some embodiments, along the direction parallel to the frame of the display panel 10, the first camera module 21 and the second camera module 22 may be respectively located on two sides of the display panel 10. At this time, the distance between the first camera module 21 and the second camera module 22 may be relatively long, such that the overlapping range of the viewing angles of the first camera module 21 and the second camera module 22 is relatively small. Therefore, the first camera module 21 and the second camera module 22 may have a larger viewing angle to collect more image information. At the same time, the first camera module 21 and the second camera module 22 may collect image information based on different positions, and the position information of the first camera module 21 and the second camera module 22 and the image information collected by them can be integrated using an algorithm to obtain a more stereoscopic imaging effect, which is beneficial to improving the stereoscopic imaging effect.

In some embodiments, the vertical projections of the first camera module 21 and the second camera module 22 on the display panel 10 may be located on the same side of the display panel 10, which is more in line with the user's habit of grabbing the display module, and prevents the user from blocking the first camera module 21 and the second camera module 22 when grabbing the display module to take pictures.

It should be noted that the vertical projections of the first camera module 21 and the second camera module 22 on the display panel 10 may be located on any side of the display panel 10. Those skilled in the art can set the positions of the first camera module 21 and the second camera module 22 based on actual needs, which is not limited in the embodiments of the present disclosure.

Figure 16:
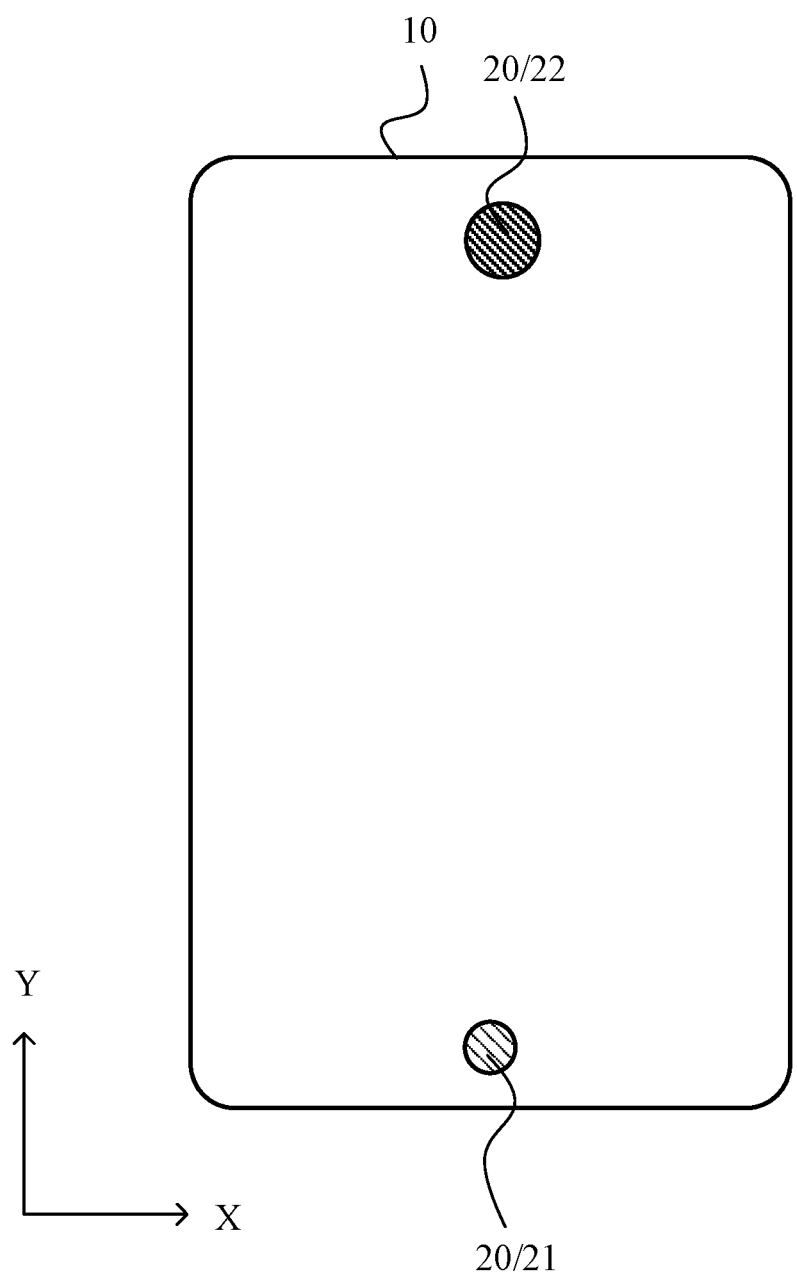
FIG. 16 is a bottom view of another display module according to an embodiment of the present disclosure.

FIG. 16 is a bottom view of another display module according to an embodiment of the present disclosure. The width of the display panel 10 in a first direction X may be greater than the length of the display panel 10 in a second direction Y. In addition, both the first direction X and the second direction Y may be parallel to the plane where the display panel 10 is located, and the first direction X and the second direction may intersect each other. The length of the display panel 10 in the second direction Y may be relatively long, such that the vertical projections of the first camera module 21 and the second camera module 22 on the display panel 10 can be located on both sides of the display panel 10 along the second direction Y, thereby increasing the distance between the first camera module 21 and the second camera module 22, and helping to reduce the overlapping range of the viewing angles of the first camera module 21 and the second camera module 22. In this way, the first camera module 21 and the second camera module 22 can have a larger viewing angle, which is beneficial to collecting more image information.

Figure 17:
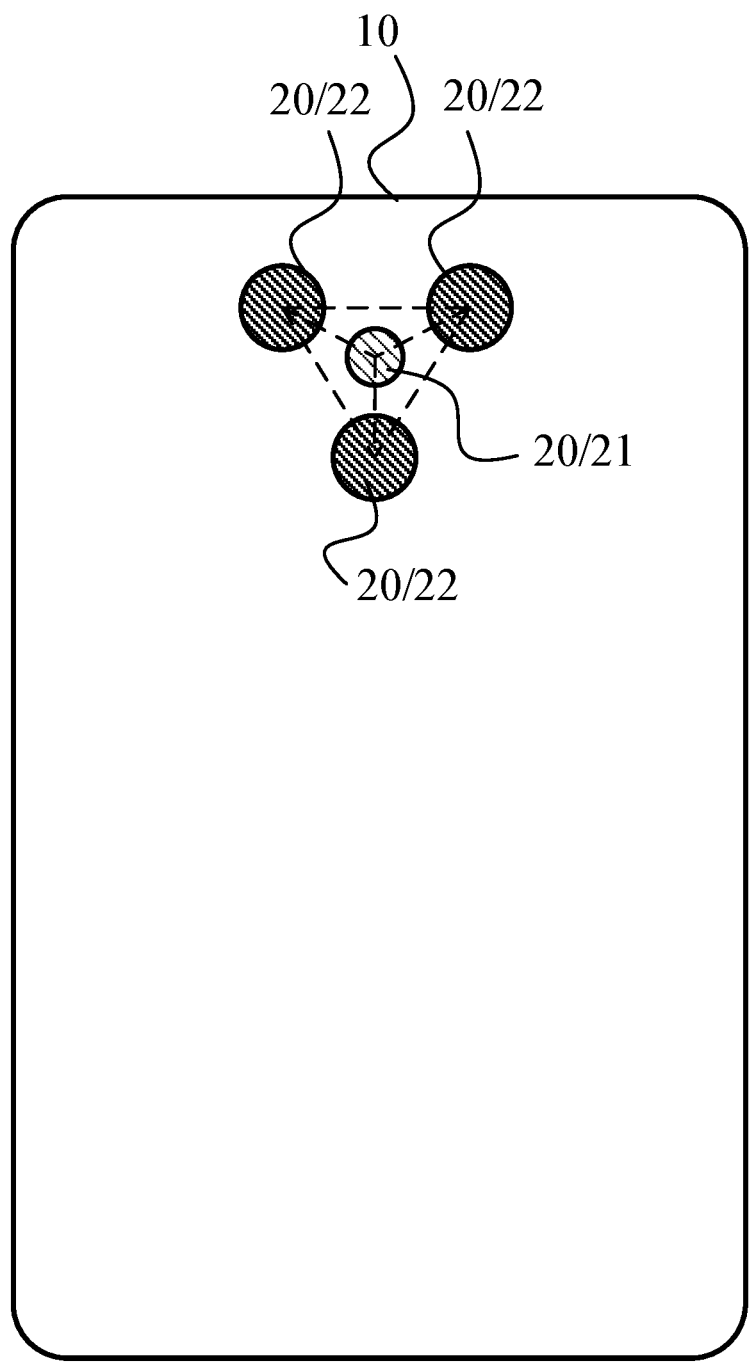
FIG. 17 is a bottom view of another display module according to an embodiment of the present disclosure.

FIG. 17 is a bottom view of another display module according to an embodiment of the present disclosure. Refer to FIG. 17. In some embodiments, the camera module 20 may include a plurality of second camera modules 22, and the arrangement of the plurality of second camera modules 22 is beneficing to increasing the sum of the photosensitive areas of the camera module 20, thereby facilitating the collection of more information. In addition, the second camera modules 22 may be arranged around the first camera module 21, such that the second camera modules 22 can collect image information from multiple positions. The position information of the first camera module 21 and the second camera module 22 and the image information collected by them can be integrated using an algorithm to obtain a more stereoscopic imaging effect, which is beneficial to improving the stereoscopic imaging effect.

In some embodiments, the distances between the first camera module 21 and the second camera modules 22 adjacent to it may be the same, such that it is convenient to integrate the signals collected by the first camera module 21 arranged in the center of the second camera modules 22 around the first camera module 21 through the algorithm, thereby simplifying the algorithm. In some embodiments, the distances between the second camera modules 22 arranged around the first camera module 21 may also be the same, thereby facilitating the integration of the signals collected by each second camera module 22 through the algorithm, which is beneficial to simplifying the algorithm.

It should be noted that FIG. 14 exemplarily shows that the camera module 20 includes three second camera modules 22, and the three second camera modules 22 are arranged in an equilateral triangle. Those skilled in the art can set the number and arrangement of the second camera modules 22 and the distances between the camera module 20 based on actual needs, which will not be described in detail here.

Figure 18:
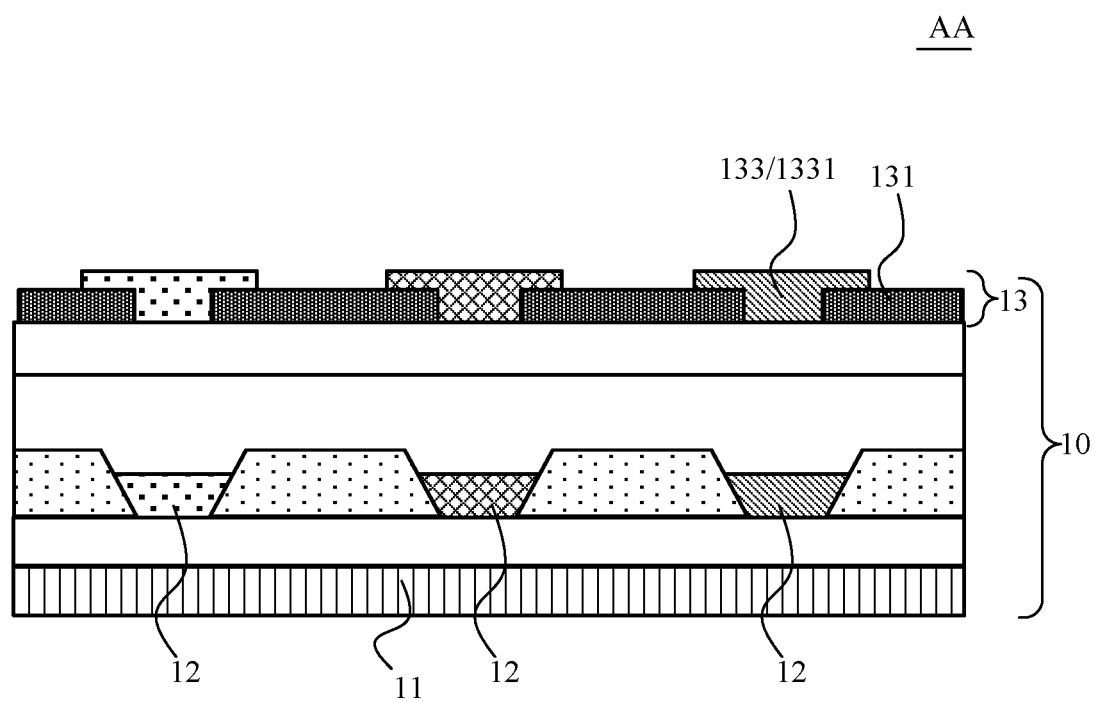
FIG. 18 is a partial cross-sectional view of a regular display area in the display panel according to an embodiment of the present disclosure.

FIG. 18 is a partial cross-sectional view of a regular display area in the display panel according to an embodiment of the present disclosure. Refer to FIG. 1 and FIG. 18. In some embodiments, the display panel 10 may include a plurality of light-emitting units 12. The display panel 10 may be an organic light-emitting display panel, and the light-emitting unit 12 in the display panel 10 may be an organic light-emitting unit, which is used to realize the normal display of the display panel 10.

The display panel 10 may also include a filter layer 13, and the filter layer 13 may be disposed on a side of the light-emitting unit 12 facing the light-emitting surface of the display panel 10.

The display panel 10 may also include a regular display area AA adjacent to the light-transmitting display area FA. In some embodiments, the regular display area AA may at least partially surround the light-transmitting display area FA.

In the regular display area AA, the filter layer 13 may include the second color resist 133, and the second color resist 133 may include a plurality of color resists 1331 having the same color as the light-emitting unit 12. The color resists 1331 may be arranged in an array along a direction parallel to the plane where the display panel 10 is located. In addition, along the direction perpendicular to the plane where the display panel 10 is located, the second color resist 133 may at least partially overlap with the light-emitting unit 12 of the same color. The light emitted by the light-emitting unit 12 may be emitted through the second color resist 133 of the same color for the regular display area AA to display normally. The arrangement of the second color resist 133 can effectively reduce the effect of external ambient light reflected in the display panel 10 and improve the display effect of the display panel 10.

In the regular display area AA, the filter layer 13 may further include the light-shielding part 131, and along the direction parallel to the plane where the display panel 10 is located, the light-shielding part 131 may be located between adjacent second color resists 133. External ambient light cannot enter the interior of the display panel 10 through the light-shielding part 131, which can further reduce the effect external ambient light reflected in the display panel 10 and improve the display effect of the display panel 10.

Figure 19:
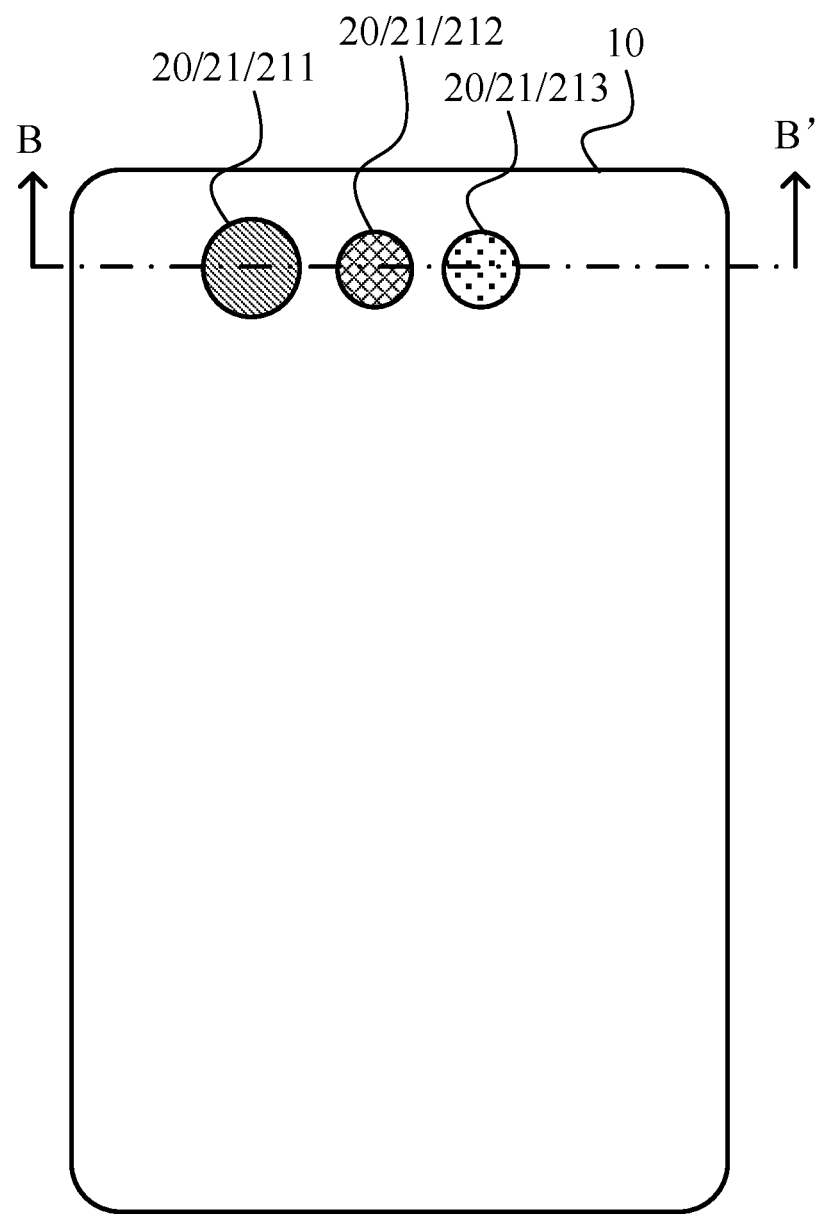
FIG. 19 is a bottom view of another display module according to an embodiment of the present disclosure.
Figure 20:
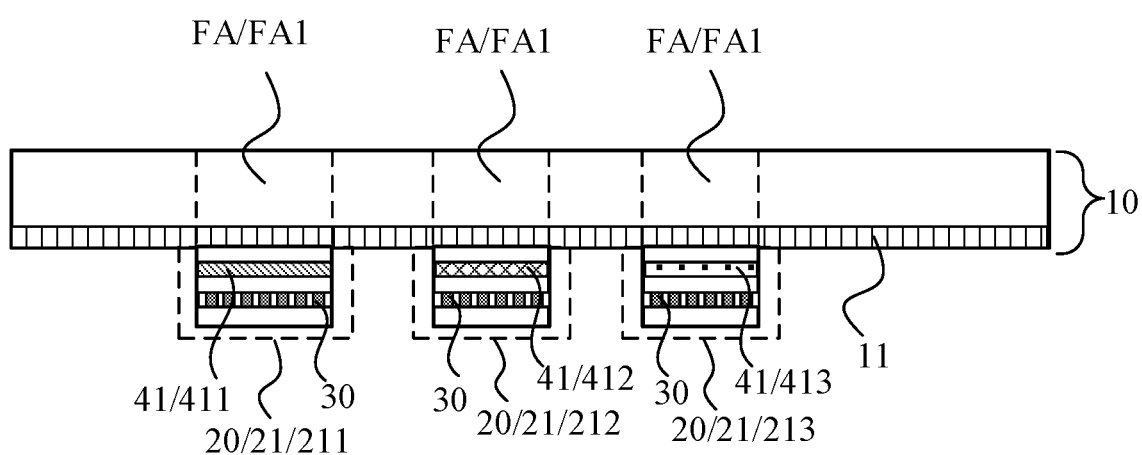
FIG. 20 is a cross-sectional view of the display module shown in FIG. 19 along line B-B'.

FIG. 19 is a bottom view of another display module according to an embodiment of the present disclosure, and FIG. 20 is a cross-sectional view of the display module shown in FIG. 19 along line B-B'. Refer to FIG. 19 and FIG. 20. In some embodiments, the camera module 20 may include at least three first camera modules 21.

The at least three first camera modules 21 may include at least one blue camera module 211, and the color resist 41 in the blue camera module 211 may be a blue color resist 411; at least one red camera module 212, and the color resist 41 in the red camera module 212 may be a red color resist 412; and at least one green camera module 213, and the color resist 41 in the green camera module 213 may be a green color resist 413.

Specifically, in the display module provided by the embodiments of the present disclosure, the camera module 20 may include at least three first camera modules 21, and the at least three first camera modules 21 may include at least one blue camera module 211, at least one red camera module 212, and at least one green camera module 213. When external ambient light passes through the light-transmitting display area FA of the display panel 10 to the blue camera module 211, the blue color resist 411 in the blue camera module 211 can filter the light except of the blue light, and then emit to the photosensitive element 30 in the blue camera module 211. Therefore, the photosensitive element 30 in the blue camera module 211 can be used to collect the blue light signals. Similarly, when external ambient light passes through the light-transmitting display area FA of the display panel 10 to the red camera module 212, the red color resist 412 in the red camera module 212 can filter the light except of the red light, and then emit to the photosensitive element 30 in the red camera module 212. Therefore, the photosensitive element 30 in the red camera module 212 can be used to collect the red light signals. when external ambient light passes through the light-transmitting display area FA of the display panel 10 to the green camera module 213, the green color resist 413 in the green camera module 213 can filter the light except of the green light, and then emit to the photosensitive element 30 in the green camera module 213. Therefore, the photosensitive element 30 in the green camera module 213 can be used to collect the green light signals. An algorithm can be used to integrate the blue light signals collected by the blue camera module 211, the red light signals collected by the red camera module 212, and the green light signals collected by the green camera module 213, thereby achieving a color imaging effect.

Refer to FIG. 19 and FIG. 20. In some embodiments, along the direction perpendicular to the plane where the display panel 10 is located, the projected area of the blue camera module 211 on the display panel 10 may be larger than the projected of the red camera module 212 on the display panel 10 and/or the projected area of the green camera module 213 on the display panel 10. That is, the size of the blue camera module 211 in the display module can be increased.

Specifically, since the light transmittance of each film layer in the display panel 10 will not reach 100%, and the transmittance of the same film layer for light of different wavelengths is also different, it is easy to cause the amount of light of some wavelengths to be reduced. Compared with the amount of red light received by the red camera module 212, and/or the amount of green light received by the green camera module 213, the amount of blue light received by the blue camera module 211 may be limited. At this time, the size of the blue camera module 211 in the display module may be increased to increase the amount of blue light received by the blue camera module 211. In this way, after integrating the blue light signals collected by the blue camera module 211, the red light signals collected by the red camera module 212, and the green light signals collected by the green camera module 213 through an algorithm, the imaging effect can be improved.

It should be noted that FIG. 19 and FIG. 20 exemplarily show the size ratio of the blue camera module 211, the red camera module 212, and the green camera module 213 in the display module. In some other embodiment of the present disclosure, those skilled in the art can set the size of the blue camera module 211, the red camera module 212, and the green camera module 213 based on actual needs. Further, along the direction perpendicular to the plane where the display panel 10 is located, the projected area of the blue camera module 211 on the display panel 10 may be larger than the projected area of the red camera module 212 on the display panel 10 and/or the projected area of the green camera module 213 on the display panel 10. This arrangement falls within the protection scope of the present disclosure, which will not be described in detail here.

Figure 21:
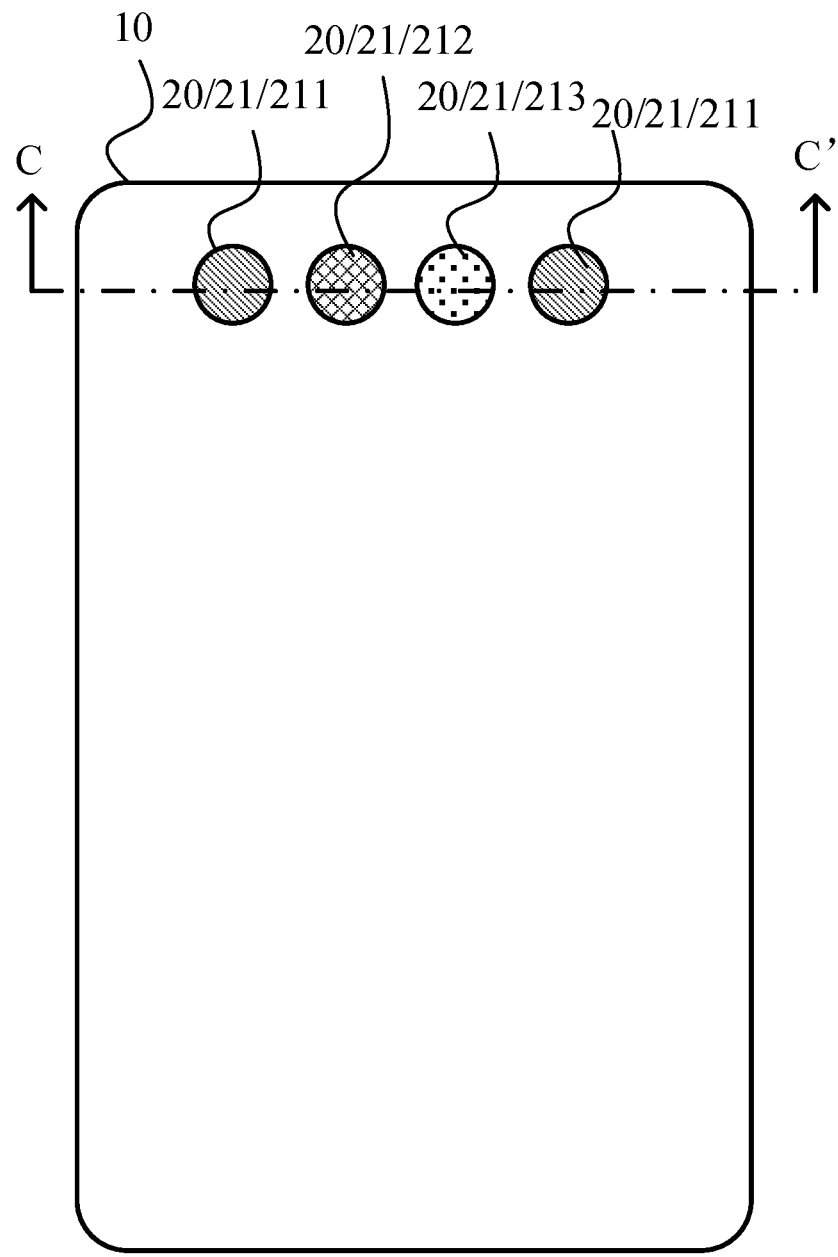
FIG. 21 is a bottom view of another display module according to an embodiment of the present disclosure.

FIG. 21 is a bottom view of another display module according to an embodiment of the present disclosure. Refer to FIG. 21. In some embodiments, the number of blue camera modules 211 may be greater than the number of red camera modules 212 and/or green camera modules 213.

Specifically, since the light transmittance of each film layer in the display panel 10 will not reach 100%, and the transmittance of the same film layer for light of different wavelengths is also different, it is easy to cause the amount of light of some wavelengths to be reduced. Compared with the amount of red light received by the red camera module 212, and/or the amount of green light received by the green camera module 213, the amount of blue light received by the blue camera module 211 may be limited. At this time, the number of blue camera modules 211 in the display module can be increased such that the total amount of blue light received by the blue camera modules 211 in the display module can be the sum of the amount of blue light received by each blue camera module 211, thereby effectively increasing the amount of blue light received by the blue camera modules 211 in the display module. In this way, after integrating the blue light signals collected by the blue camera module 211, the red light signals collected by the red camera module 212, and the green light signals collected by the green camera module 213 through an algorithm, the imaging effect can be improved.

It should be noted that FIG. 21 exemplarily shows that there are two blue camera modules 211, one red camera module 212, and one green camera module 213 in the display module. In some other embodiments of the present disclosure, those skilled in the art can set the number of blue camera modules 211, red camera modules 212, and green camera modules 213 based on actual needs, and the number of blue camera modules 211 being greater than the number of red camera modules 212 and/or green camera modules 213 is within the protection scope of the present disclosure, which will not be described in detail here.

Figure 22:
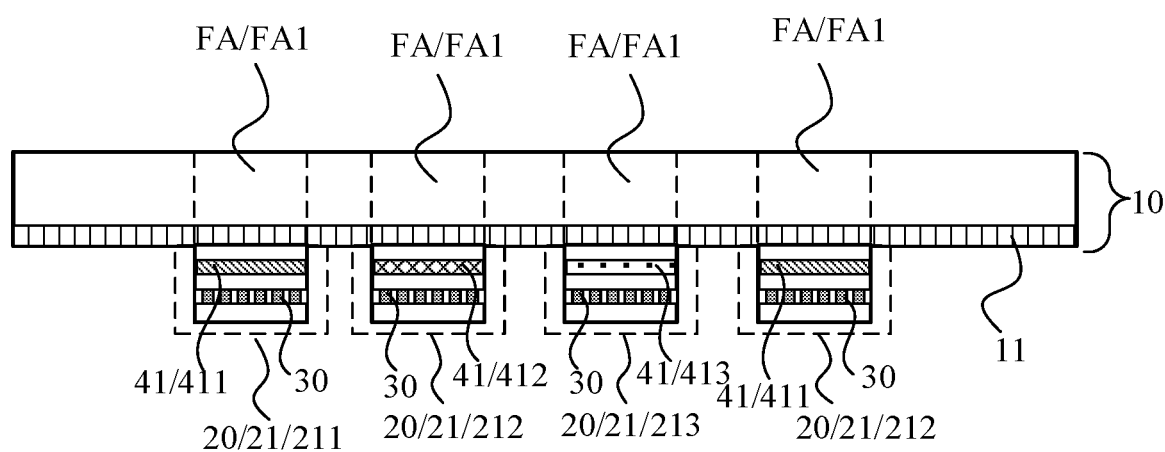
FIG. 22 is a cross-sectional view of the display module shown in FIG. 21 along line C-C'.

FIG. 22 is a cross-sectional view of the display module shown in FIG. 21 along line C-C'. Refer to FIG. 21 and FIG. 22. In some embodiments, the camera module 20 may include a plurality of first camera modules 21, and the plurality of first camera modules 21 may include at least two blue camera modules 211, the color resists 41 in the blue camera modules 211 being blue color resists 411; at least two red camera modules 212, the color resists 41 in the blue camera modules 211 being red color resists 412; and at least two green camera modules 213, the color resists 41 in the green camera modules 213 being green color resists 413, where the at least two blue camera modules 211 may be respectively on both sides of the red camera module 212 and green camera module 213.

Specifically, in the display module provided by the embodiments of the present disclosure, the camera module 20 may include a plurality of first camera modules 21, and the plurality of first camera modules 21 may include at least two blue camera modules 211, at least two red camera modules 212, and at least two green camera modules 213. The number of blue camera modules 211 may be greater than the number of red camera modules 212 and/or green camera modules 213. Since the light transmittance of each film layer in the display panel 10 will not reach 100%, and the transmittance of the same film layer for light of different wavelengths is also different, it is easy to cause the amount of light of some wavelengths to be reduced. Compared with the amount of red light received by the red camera module 212, and/or the amount of green light received by the green camera module 213, the amount of blue light received by the blue camera module 211 may be limited. At this time, the number of blue camera modules 211 in the display module can be increased such that the total amount of blue light received by the blue camera modules 211 in the display module can be the sum of the amount of blue light received by each blue camera module 211, thereby effectively increasing the amount of blue light received by the blue camera modules 211 in the display module. In this way, after integrating the blue light signals collected by the blue camera module 211, the red light signals collected by the red camera module 212, and the green light signals collected by the green camera module 213 through an algorithm, the imaging effect can be improved At the same time, the at least two blue camera modules 211 may be respectively on both sides of the red camera module 212 and the green camera module 213. The distance between the blue camera modules 211 on both sides of the red camera module 212 and the green camera module 213 may be relatively long, and the overlapping range of viewing angles between the blue camera modules 211 on both sides of the red camera module 212 and the green camera module 213 may be relatively small. In this way, the blue camera modules 211 on both sides of the red camera module 212 and the green camera module 213 can have a larger viewing angle, which is beneficial to collecting more image information. At the same time, each blue camera module 211 may collect image information based on different positions. An algorithm may be used to integrate the position information of each blue camera module 211 and the image information collected by the blue camera modules 211 to obtain a more stereoscopic imaging effect, which is beneficial to improving the stereoscopic imaging effect.

Figure 23:
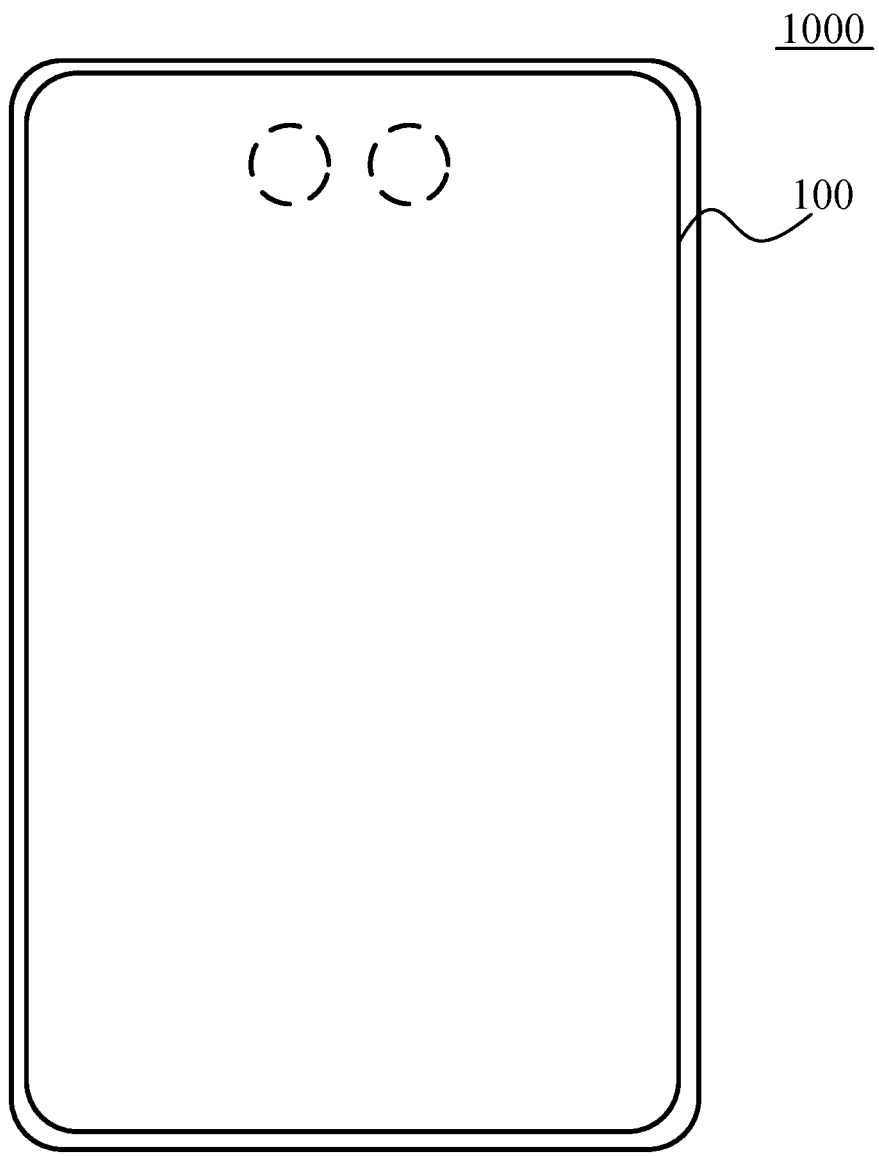
FIG. 23 is a schematic plan view of a display device according to an embodiment of the present disclosure.

FIG. 23 is a schematic plan view of a display device 1000 according to an embodiment of the present disclosure. Refer to FIG. 23. In some embodiments, the display device 1000 provided in this embodiment of the present disclosure may include a display module 100 provided in the foregoing embodiments. The embodiment of FIG. 23 takes the mobile phone as an example to illustrate the display device 1000. It should be understood that the display device 1000 provided in the embodiments of the present disclosure may also be a display device 1000 with a display function, such as a computer, a television, a vehicle-mounted display device, etc., which is not limited in the embodiments of the present disclosure. The display device 1000 provided in the embodiments of the present disclosure has the beneficial effect of the display device 1000 provided in the embodiments of the present disclosure. For detail, reference can be made to the specific description of the display module 100 in the foregoing embodiments, which will not be repeated here.

Consistent with the present disclosure, the display module and the display device provided by the embodiments of the present disclosure at least achieve the following beneficial effects. In the display module provided by the embodiments of the present disclosure, at least one camera module may be arranged with a monochrome filter structure, and the color of the color resists in the monochrome filter structure may be of the same color, which is beneficial to increasing the amount of light that is the same color as the color of the color resists to the photosensitive element. Further, by adding a camera module 20 including a monochrome filter structure, more signals of monochromatic light with the same color as the color resists may be collected. The camera module may be integrated with the signals collected by other camera modules. The signals collected by the camera module may compensate the light signals of some wavelengths in the signals collected by other camera modules. In this way, the color distortion of the camera module affecting the imaging effect caused by the lack of light signals of some wavelengths can be effectively alleviated, which is beneficial to improving the imaging effect when taking pictures and improving user experience.

Although some specific embodiments of the present disclosure are described by examples in detail, those skilled in the art should understand that the above examples are only schematic and are not intended to limit the scope of the present disclosure. Those skilled in the art should understand that the above embodiments may be modified without deviating from the scope and spirit of the present disclosure. The scope of the disclosure is defined by the attached claims.

What is claimed is:

1. A display module comprising:
  a display panel, the display panel including:
  at least one light-transmitting display area; and
  at least one camera module, the at least one camera module being located on a side away from a light-emitting surface of the display panel, the at least one camera module being arranged to correspond to the at least one light-transmitting display area, the at least one camera module including at least one first camera module that includes:
a photosensitive element, and
a light filtering structure, the light filtering structure being located on a side of the photosensitive element facing the display panel, the light filtering structure including at least one color resist, along a direction perpendicular to a plane where the at least one first camera module is located, the at least one color resist at least partially overlapping with the photosensitive element, wherein:
the light filtering structure includes a monochrome filter structure including one or more color resists having a same color, and
the at least one camera module further including at least one second camera module, a filter structure in the at least one second camera module being a color filter structure, and the color filter structure including two or more color resists of different colors arranged in an array along a direction parallel to a plane where the filter structure is located,
wherein at least one second camera module and at least one first camera module are respectively located at two different light-transmitting display areas separated by a regular display area, and signals collected by the at least one first camera module containing the monochrome filter structure are used to compensate signals collected by the at least one second module containing the color filter structure.

2. The display module of claim 1, wherein:
the display panel includes a substrate, the substrate being located on a side of the display panel facing the at least one camera module, a material of the substrate including polyimide.

3. The display module of claim 1, wherein:
the at least one camera module includes two or more camera modules arranged in a straight line.

4. The display module of claim 1, wherein:
the at least one camera module includes n camera modules, n being an integer greater than equal to 3, the n camera modules not being arranged on a same straight line, along a direction parallel to a plane where the display panel is located, a linear distance of at least one of the n camera modules being the same between two adjacent camera modules.

5. The display module of claim 1, wherein:
the light-transmitting display area includes at least one first light-transmitting display area, the at least one first camera module being arranged corresponding to the at least one first light-transmitting display area.

6. The display module of claim 5, wherein:
the display panel includes a plurality of light-emitting units and a filter layer, the filter layer being located on a side of the light-emitting units facing the light-emitting surface of the display panel; and
in the first light-transmitting display area, the filter layer includes a light-shielding part, at least part of the light-shielding part including a gap, along the direction perpendicular to the plane where the display panel is located, the gap being located between adjacent light-emitting units, and the gap passing through the light-shielding part.

7. The display module of claim 6, wherein:
in the first light-transmitting display area, the filter layer includes a first color resist, the first color resist at least partially filling the gap, the color of the first color resist being consistent with the color of the color resist in the monochrome filter structure.

8. The display module of claim 5, wherein:
the display panel includes a plurality of light-emitting units and a filter layer, the filter layer being located on a side of the light-emitting units facing the light-emitting surface of the display panel; and
in the first light-transmitting display area, the filter layer includes:
a first color resist, along the direction perpendicular to the plane where the display panel is located, the first color resist being located between adjacent light-emitting units;
a second color resist, the second color resist including a plurality of color resists having the same color as the light-emitting units, the color resists being arranged in an array along the direction parallel to the plane where the display panel is located, along the direction perpendicular to the plane where the display panel is located, the second color resist at least partially overlapping with the light-emitting units of the same color, wherein:
along the direction parallel to the plane where the display panel is located, the first color resist is adjacent to the second color resist, and the color of the first color resist is consistent with the color of the color resist in the monochrome filter structure.

9. The display module of claim 8, wherein:
along the direction perpendicular to the plane where the display panel is located, at least part of the first color resist and the color resist in the monochrome filter structure at least partially overlap.

10. The display module of claim 5, wherein:
the color resist in the monochrome filter structure is a blue color resist.

11. The display module of claim 5, wherein:
the display panel includes a plurality of light-emitting units and a filter layer, the filter layer being located on a side of the light-emitting units facing the light-emitting surface of the display panel;
in the regular display area, the filter layer includes:
a second color resist, the second color resist including a plurality of color resists having the same color as the light-emitting units, the color resists being arranged in an array along the direction parallel to the plane where the display panel is located, along the direction perpendicular to the plane where the display panel is located, the second color resist at least partially overlapping with the light-emitting units of the same color; and
a light-shielding part, along the direction parallel to the plane where the display panel is located, the light-shielding part being located between adjacent second color resists.

12. The display module of claim 5, wherein:
the camera module includes at least three first camera modules, the at least three first camera modules including:
at least one blue camera module, the color resist in the blue camera module being a blue color resist;
at least one red camera module, the color resist in the red camera module being a red color resist; and
at least one green camera module, the color resist in the green camera module being a green color resist.

13. The display module of claim 12, wherein:
along the direction perpendicular to the plane where the display panel is located, a projected area of the blue camera module on the display panel is larger than a projected area of the red camera module on the display panel and/or the green camera module on the display panel.

14. The display module of claim 12, wherein:
the number of blue camera modules is greater than the number of red camera modules and/or the number of the green camera modules.

15. The display module of claim 5, wherein:
the camera module includes a plurality of first camera modules, the plurality of first camera modules including:
at least two blue camera modules, the color resists in the blue camera modules being blue color resists;
at least one red camera module, the color resist in the red camera module being a red color resist; and
at least one green camera module, the color resist in the green camera module being a green color resist, wherein:
the at least two blue camera modules are respectively located on both sides of the red camera module and the green camera module.

16. The display module of claim 1, wherein:
the display panel includes a plurality of light-emitting units and a filter layer, the filter layer being located on a side of the light-emitting units facing the light-emitting surface of the display panel; and
in the second light-transmitting display area, the filter layer includes:
a second color resist, the second color resist including a plurality of color resists having a same color as the light-emitting units, the plurality of color resists being arranged in an array along the direction parallel to the plane where the display panel is located, along the direction perpendicular to the plane where the display panel is located, the second color resist at least partially overlapping with the light-emitting units of the same color;
a light-transmitting area, along the direction parallel to the plane where the display panel is located, the light-transmitting area being located between adjacent second color resists, wherein:
at least part of the light-transmitting area at least partially overlaps with at least part of the plurality of color resists in the color filter structure.

17. The display module of claim 1, wherein:
along the direction perpendicular to the plane where the display panel is located, a projected area of the first camera module on the display panel is S1;
a projected area of the second camera module on the display panel is S2; and
$S1 = \frac{1}{3} S2$.

18. The display module of claim 1, wherein:
along the direction parallel to the plane where the display panel is located, the number of photosensitive elements included in a unit area of the first camera module is equal to one third of the number of photosensitive elements included in a unit area of the second camera module.

19. The display module of claim 1, wherein:
along the direction parallel to a frame of the display panel is located, the first camera module and the second camera module are respectively located on both sides of the display panel.

20. The display module of claim 1, wherein:
the camera module includes a plurality of second camera modules arranged around the first camera module.

21. A display device comprising:
a display module, the display module including:
a display panel, the display panel including:
at least one light-transmitting display area; and
at least one camera module, the at least one camera module being located on a side away from a light-emitting surface of the display panel, the at least one camera module being arranged to correspond to the at least one light-transmitting display area,
the at least one camera module including at least one first camera module that includes:
at least two adjacent photosensitive elements, and
a light filtering structure, the light filtering structure being located on a side of the at least two adjacent photosensitive elements facing the display panel, the light filtering structure including at least one color resist, along a direction perpendicular to a plane where the at least one first camera module is located, the at least one color resist at least partially overlapping with the at least two adjacent photosensitive elements, wherein:
the light filtering structure includes a monochrome filter structure including one or more color resists having a same color, and
the at least one camera module further including at least one second camera module, a filter structure in the at least one second camera module being a color filter structure, and the color filter structure including two or more color resists of different colors arranged in an array along a direction parallel to a plane where the filter structure is located,
wherein at least one second camera module and at least one first camera module are respectively located at two different light-transmitting display areas separated by a regular display area, and signals collected by the at least one first camera module containing the monochrome filter structure are used to compensate signals collected by the at least one second module containing the color filter structure.

* * * * *